United States Patent
Oh et al.

(10) Patent No.: US 9,159,260 B2
(45) Date of Patent: Oct. 13, 2015

(54) MOBILE TERMINAL

(71) Applicant: LG Electronics Inc., Seoul (KR)

(72) Inventors: Seokhwan Oh, Seoul (KR); Kyungtae Yang, Seoul (KR); Minsoo Kim, Seoul (KR); Daiki Min, Seoul (KR); Myungsoo Choi, Seoul (KR); Seonki Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 53 days.

(21) Appl. No.: 14/084,489

(22) Filed: Nov. 19, 2013

(65) Prior Publication Data

US 2014/0210803 A1     Jul. 31, 2014

(30) Foreign Application Priority Data

Jan. 29, 2013   (KR) .................. 10-2013-0010051

(51) Int. Cl.
| | |
|---|---|
| *G09G 3/20* | (2006.01) |
| *G06F 1/16* | (2006.01) |
| *H04B 1/3888* | (2015.01) |
| *H04M 1/04* | (2006.01) |
| *H05K 5/03* | (2006.01) |
| *H04M 1/02* | (2006.01) |

(52) U.S. Cl.
CPC .............. *G09G 3/20* (2013.01); *G06F 1/1626* (2013.01); *G06F 1/1677* (2013.01); *H04B 1/3888* (2013.01); *H04M 1/0245* (2013.01); *H04M 1/04* (2013.01); *H05K 5/03* (2013.01); *G06F 2200/1633* (2013.01); *H04M 1/0214* (2013.01)

(58) Field of Classification Search
CPC ............ H04M 1/0245; H04M 1/0266; H04M 1/0283; H04M 1/0214; G06F 1/1616; G06F 1/1681; G06F 1/1626; G06F 1/1677; G06F 2200/1633; H04B 1/3888; G09G 3/20
USPC ................... 345/204–214, 690–699; 455/566, 455/575.1–575.8
See application file for complete search history.

(56) References Cited

U.S. PATENT DOCUMENTS

| | | | | |
|---|---|---|---|---|
| 6,898,073 | B2 * | 5/2005 | Lin ........................ | 361/679.08 |
| 7,639,479 | B2 * | 12/2009 | Chuang et al. ......... | 361/679.06 |
| 7,907,394 | B2 * | 3/2011 | Richardson et al. .... | 361/679.3 |
| 8,657,112 | B2 * | 2/2014 | Igarashi ................. | 206/320 |
| 8,704,427 | B2 * | 4/2014 | Futter et al. ............ | 310/339 |
| D714,053 | S  * | 9/2014 | Yoo ........................ | D3/269 |

(Continued)

FOREIGN PATENT DOCUMENTS

| | | | | |
|---|---|---|---|---|
| EP | 2059005 | * | 5/2009 | ............ H04M 1/02 |
| WO | 2012143711 | * | 10/2012 | |

OTHER PUBLICATIONS

European Patent Office Application Serial No. 13005278.0, Search Report dated May 28, 2014, 7 pages.

*Primary Examiner* — Dmitriy Bolotin
(74) *Attorney, Agent, or Firm* — Lee, Hong, Degerman, Kang & Waimey

(57) ABSTRACT

A mobile terminal includes a terminal body including a display unit formed on one surface thereof, a cover coupled to the terminal body such that it can be converted into a closed state in which the display is covered and an opened state in which the display unit is exposed, a signal generating unit configured to generate a state signal according to the closed state and the opened state, and a controller configured to control the display unit such that the display unit is activated in the opened state on the basis of the state signal.

17 Claims, 17 Drawing Sheets

(56) References Cited

U.S. PATENT DOCUMENTS

| | | | |
|---|---|---|---|
| 8,842,423 B2* | 9/2014 | Griffin | 361/679.08 |
| 8,847,979 B2* | 9/2014 | Smith et al. | 345/619 |
| D714,550 S* | 10/2014 | Yoo | D3/269 |
| D721,359 S* | 1/2015 | Kim | D14/250 |
| 8,953,310 B2* | 2/2015 | Smith et al. | 361/679.29 |
| 8,964,364 B2* | 2/2015 | Abdelsamie et al. | 361/679.03 |
| D723,534 S* | 3/2015 | Kim et al. | D14/250 |
| 2004/0005184 A1* | 1/2004 | Kim et al. | 400/472 |
| 2004/0203502 A1* | 10/2004 | Dietrich et al. | 455/90.3 |
| 2005/0054391 A1 | 3/2005 | Chen | |
| 2007/0286556 A1* | 12/2007 | Kassamakov et al. | 385/88 |
| 2008/0096620 A1* | 4/2008 | Lee et al. | 455/575.8 |
| 2009/0124308 A1* | 5/2009 | Lee | 455/575.3 |
| 2009/0314400 A1* | 12/2009 | Liu | 150/165 |
| 2009/0319222 A1* | 12/2009 | Katayama | 702/150 |
| 2010/0045628 A1* | 2/2010 | Gettemy et al. | 345/173 |
| 2011/0090626 A1* | 4/2011 | Hoellwarth et al. | 361/679.01 |
| 2011/0241758 A1* | 10/2011 | Futter et al. | 327/516 |
| 2012/0308981 A1* | 12/2012 | Libin et al. | 434/362 |
| 2013/0076614 A1* | 3/2013 | Ive et al. | 345/156 |
| 2013/0100363 A1* | 4/2013 | Kakinuma et al. | 349/13 |
| 2013/0233762 A1* | 9/2013 | Balaji et al. | 206/736 |
| 2013/0328825 A1* | 12/2013 | Brown et al. | 345/174 |
| 2014/0029171 A1* | 1/2014 | Lee | 361/679.01 |
| 2014/0043748 A1* | 2/2014 | Sartee et al. | 361/679.27 |
| 2014/0198070 A1* | 7/2014 | Won | 345/173 |
| 2015/0031347 A1* | 1/2015 | Kim et al. | 455/418 |

\* cited by examiner

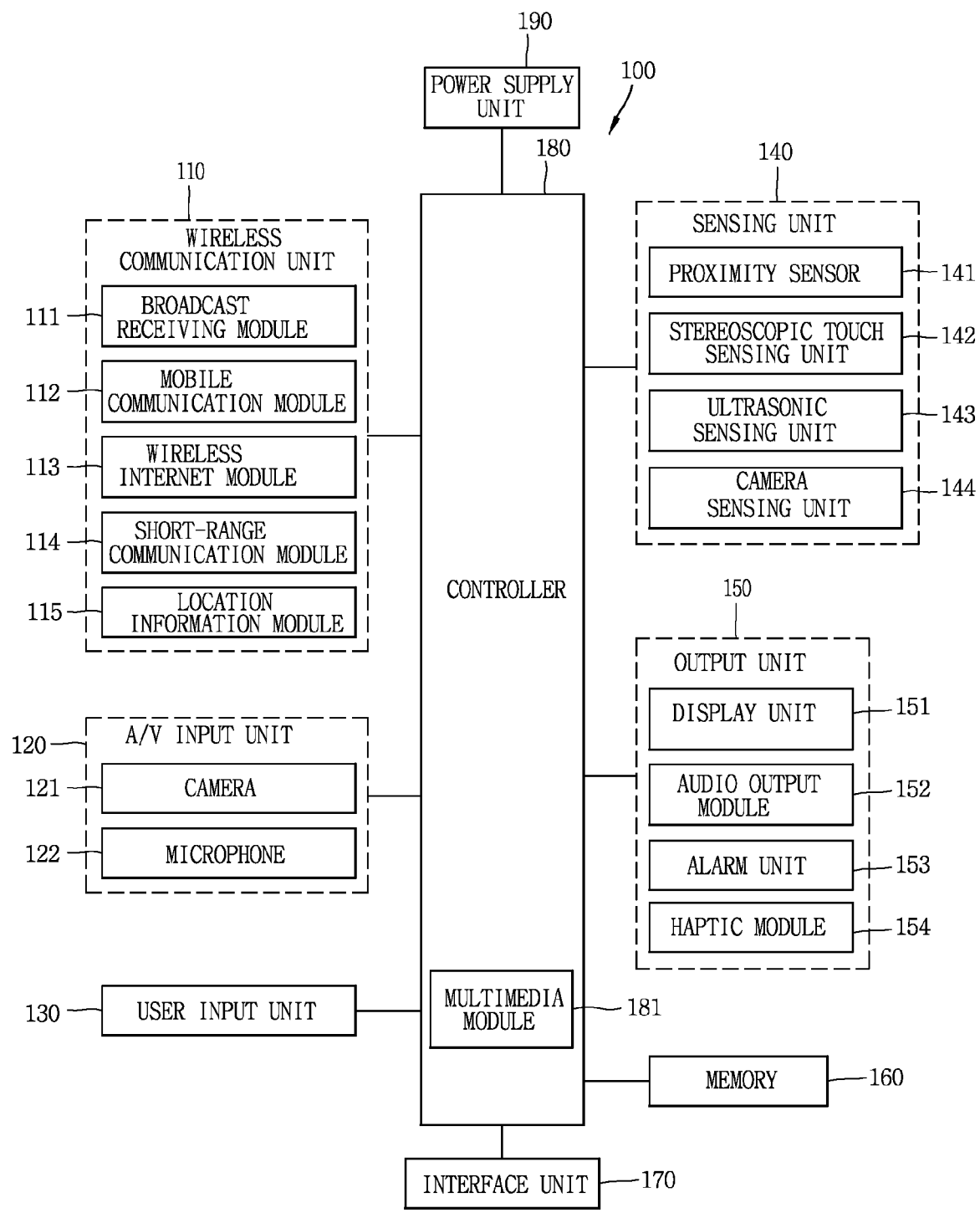

FIG. 6A
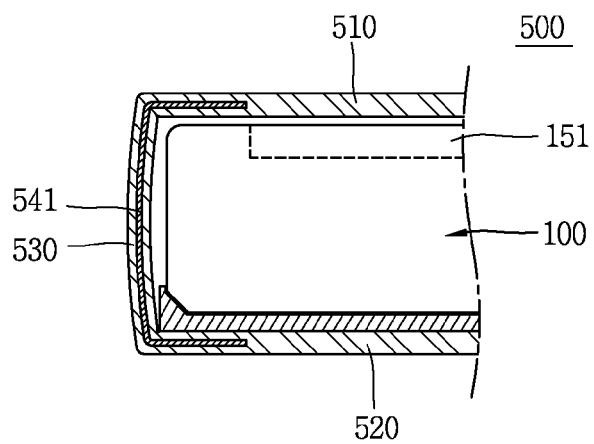
(a)
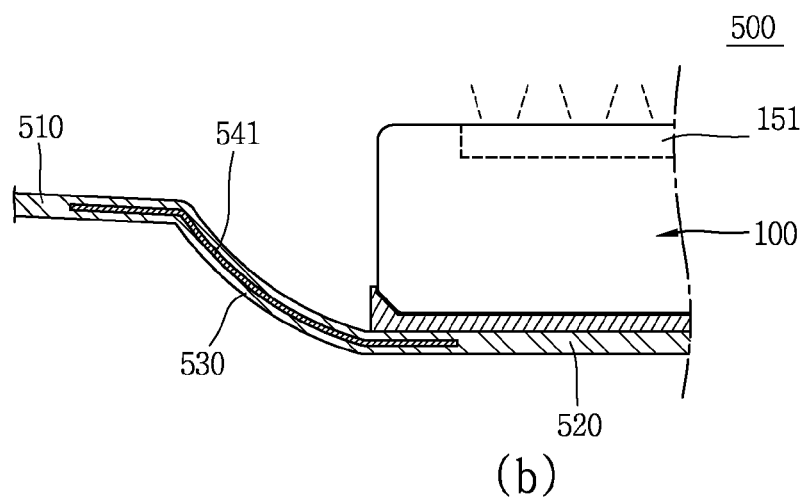
(b)
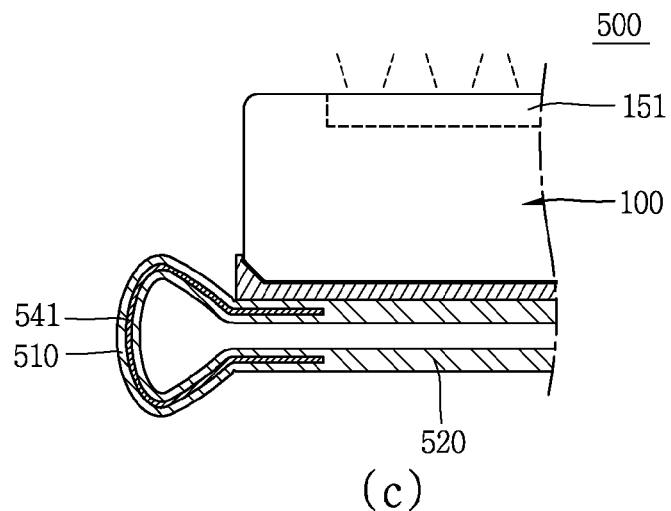
(c)

FIG. 7A
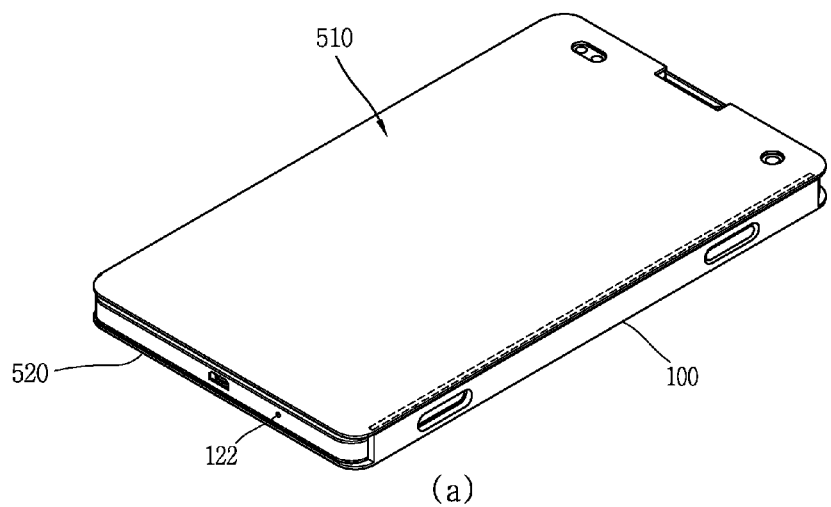
(a)
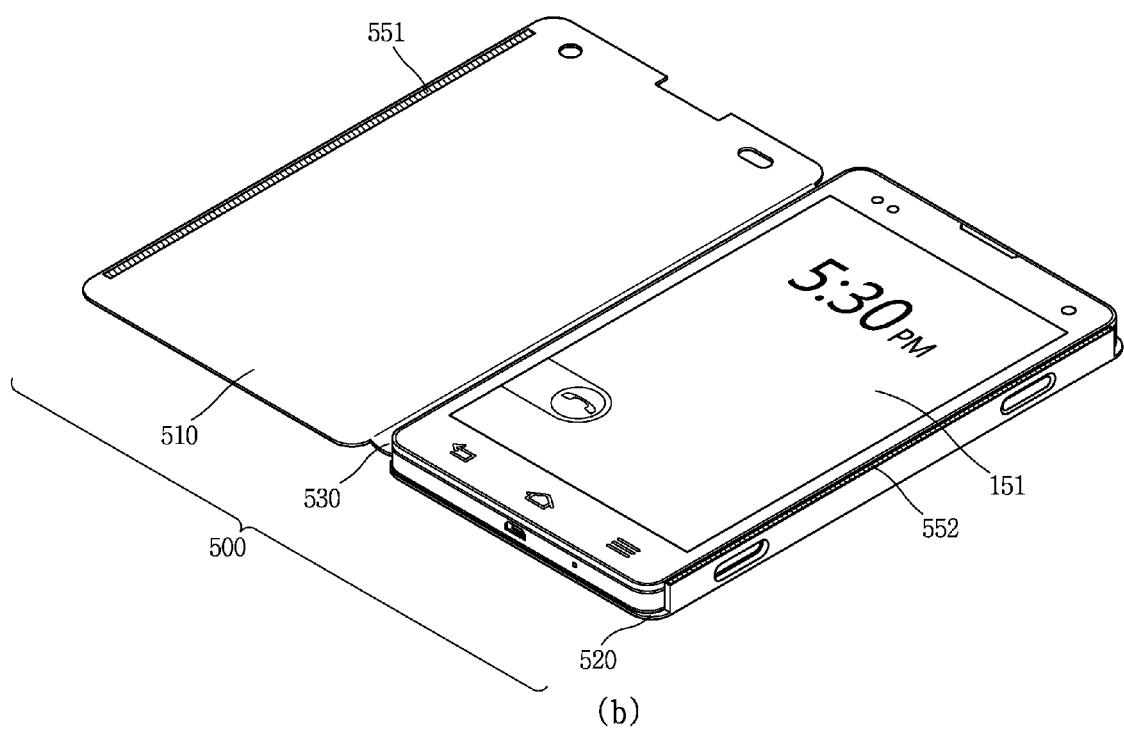
(b)

FIG. 9
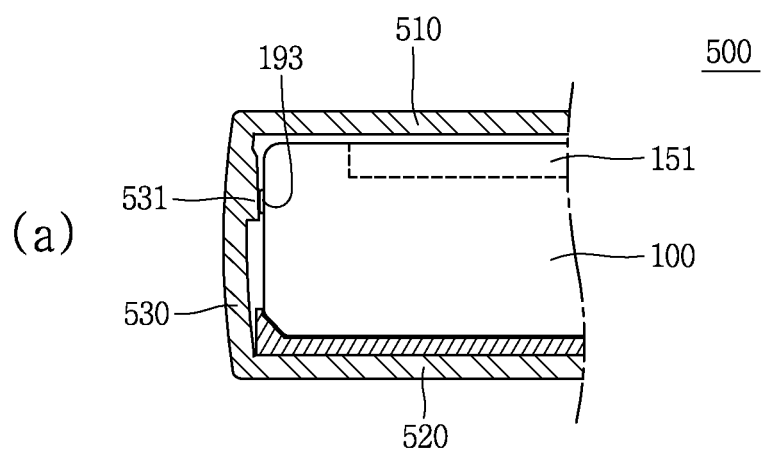
(a)
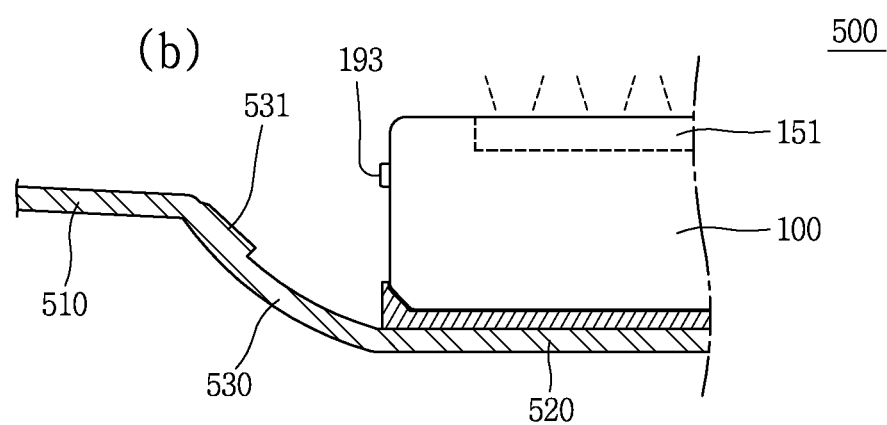
(b)

MOBILE TERMINAL

CROSS REFERENCE TO RELATED APPLICATIONS

Pursuant to 35 U.S.C. §119(a), this application claims the benefit of earlier filing date and right of priority to Korean Application No. 10-2013-0010051, filed in filed in Republic of Korea on Jan. 29, 2013 the contents of which are incorporated by reference herein in it entirety.

BACKGROUND OF THE INVENTION

1. Field of the Invention

The present invention relates to a mobile terminal installed in a cover.

2. Description of the Related Art

In general, terminals may be divided into a mobile terminal and stationary terminal according to whether or not terminals are movable. In addition, mobile terminals may be divided into a handheld terminal and a vehicle mount terminal according to whether or not users can directly carry it around.

As such functions become more diversified, the mobile terminal can support more complicated functions such as capturing images or video, reproducing music or video files, playing games, receiving broadcast signals, and the like. By comprehensively and collectively implementing such functions, the mobile terminal may be embodied in the form of a multimedia player or device. Efforts are ongoing to support and increase the functionality of mobile terminals. Such efforts include software and hardware improvements, as well as changes and improvements in the structural components which form the mobile terminal.

Recently, mobile terminals are installed in a cover covering a terminal body to protect the terminal body from external impact or for the purpose of aesthetic appearance. Covers are fabricated to have various shapes, and in particular, in order to protect a display unit, a cover covering the entirety of outer surfaces of a terminal body is used.

However, in order to activate a display unit, a user should open the cover covering the display unit and turn on power of the display unit by using a power button, or the like, causing user inconvenience.

SUMMARY OF THE INVENTION

As aspect of the present invention provides a mobile terminal in which a display unit is automatically activated in a state in which cover is open.

To achieve these and other advantages and in accordance with the purpose of the present invention, as embodied and broadly described herein, the present invention provides in one aspect a mobile terminal including: a terminal body including a display unit formed on one surface thereof; a cover coupled to the terminal body such that it can be converted into a closed state in which the display is covered and an opened state in which the display unit is exposed; a signal generating unit configured to generate a state signal according to the closed state and the opened state; and a controller configured to control the display unit such that the display unit is activated in the opened state on the basis of the state signal.

In an example related to the present invention, the cover may include: a first member movably formed to implement the opened state and the closed state of the display unit; and a second member connected to the first member and formed to cover other regions of the terminal body.

In an example related to the present invention, the cover may further include a connection portion connecting the first and second members and formed to be deformable according to a change to the closed state and the opened state, wherein the signal generating unit may include a deformation sensing film installed in the connection portion to sense deformation of the connection portion.

In an example related to the present invention, the deformation sensing film may provide a different current to the terminal body according to deformation of the connection portion, and a state signal is generated on the basis of the different current.

In an example related to the present invention, a plurality of state signals may be generated on the basis of different currents. The controller may activate the display unit and control the display unit in order to adjust brightness of the display unit on the basis of the plurality of state signals.

In an example related to the present invention, in order to sense whether the first and second members are in an overlapped state, the signal generating unit may be formed in respective overlap regions of the first and second members which overlap in the closed state.

In an example related to the present invention, the signal generating unit may include a magnet formed in the first member to change magnetism according to a change from the opened state to the closed state or from the closed state to the opened state and a sensor formed in the second member to sense a change in the magnetism.

In an example related to the present invention, the cover may further include: a terminal member electrically connected to the sensor to transmit a signal to the terminal body.

In an example related to the present invention, the controller may be connected to the sensor to control an activation state of the display unit according to a change in magnetism.

In an example related to the present invention, the first member may be movable so as to face the other surface of the terminal body in the opened state. The signal generating unit may include an identification tag installed in the first member and sensed by a short-range antenna installed within the terminal body.

In an example related to the present invention, when the tag is sensed by the short-range antenna, the signal generating unit may generate a state signal corresponding to the opened state.

In an example related to the present invention, the signal generating unit may include a conductive member installed in one surface of the first member facing the display unit and configured to change a value of flowing current upon being brought into contact with the display unit.

In an example related to the present invention, when an area in which the conductive member is brought into contact with the display unit is equal to or smaller than a pre-set reference area, the controller may control the display unit to be activated.

In an example related to the present invention, the signal generating unit may include a protrusion formed on an outer surface of the terminal body and pressurized according to a movement of the first member. When the protrusion is released from a pressurized state, the controller may control the display unit to be activated.

In an example related to the present invention, the cover may include a connection portion configured to connect the first and second members and disposed to be deformable according to a change from the closed state to the opened state or from the opened state to the closed state, wherein the connection portion may further include: a pressing unit formed in a region corresponding to the protrusion of the connection portion to pressurize the protrusion.

In an example related to the present invention, the signal generating unit may include at least one of an illumination sensor installed within the body of the terminal and configured to sense a change in intensity of illumination of the outward of the terminal body and a proximity sensor installed within the body of the terminal and configured to sense an object approaching the display unit within a pre-set distance.

In an example related to the present invention, when an increase in the intensity of illumination is sensed and an object approaching the display unit is not sensed, the controller may control the display unit to be activated.

In an example related to the present invention, the controller may activate the display unit when a pre-set time has lapsed since the state signal was generated.

To achieve these and other advantages and in accordance with the purpose of the present invention, as embodied and broadly described herein, the present invention provides in another aspect a cover of a mobile terminal, which is installed in a body of the mobile terminal having a display unit formed on one surface thereof, including: a first member formed to be movable to implement an opened state and a closed state of the display unit; a second member connected to a first region and formed to cover other regions of the terminal body; a connection portion configured to connect the first and second members and formed to be deformable according to a change from the closed state to the opened state or from the opened state to the closed state; and a deformation sensing film installed in the connection portion to sense deformation of the connection portion.

To achieve these and other advantages and in accordance with the purpose of the present invention, as embodied and broadly described herein, the present invention provides in another aspect a cover of a mobile terminal, which is installed in a body of the mobile terminal having a display unit formed on one surface thereof, including: a first member formed to be movable to implement an opened state and a closed state of the display unit; a second member connected to a first region and formed to cover other regions of the terminal body; a magnet formed in the first member to change magnetism according to a change from the opened state to the closed state or from the closed state to the opened state; and a hall sensor formed in the second member to sense a change in magnetism.

According to embodiments of the present invention, the display unit can be automatically activated according to a movement of the cover. Thus, the mobile terminal installed within the cover can be conveniently used.

Also, since an additional component for controlling the display unit according to a movement of the cover is not required in the mobile terminal, the internal structure of the terminal body can be simplified and an inner space can be secured.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by illustration only, and thus are not limitative of the present invention, and wherein:

FIG. 1 is a block diagram of a mobile terminal according to an embodiment of the present invention.

FIGS. 6A through 6C are views illustrating a cover for a mobile terminal according to a first embodiment of the present invention.

FIG. 7A is a perspective view of the mobile terminal installed in a cover according to another embodiment of the present invention.

FIG. 9 is a partial cross-sectional view illustrating a mobile terminal installed in a cover according to another embodiment of the present invention.

DETAILED DESCRIPTION OF THE INVENTION

Figure 2A:
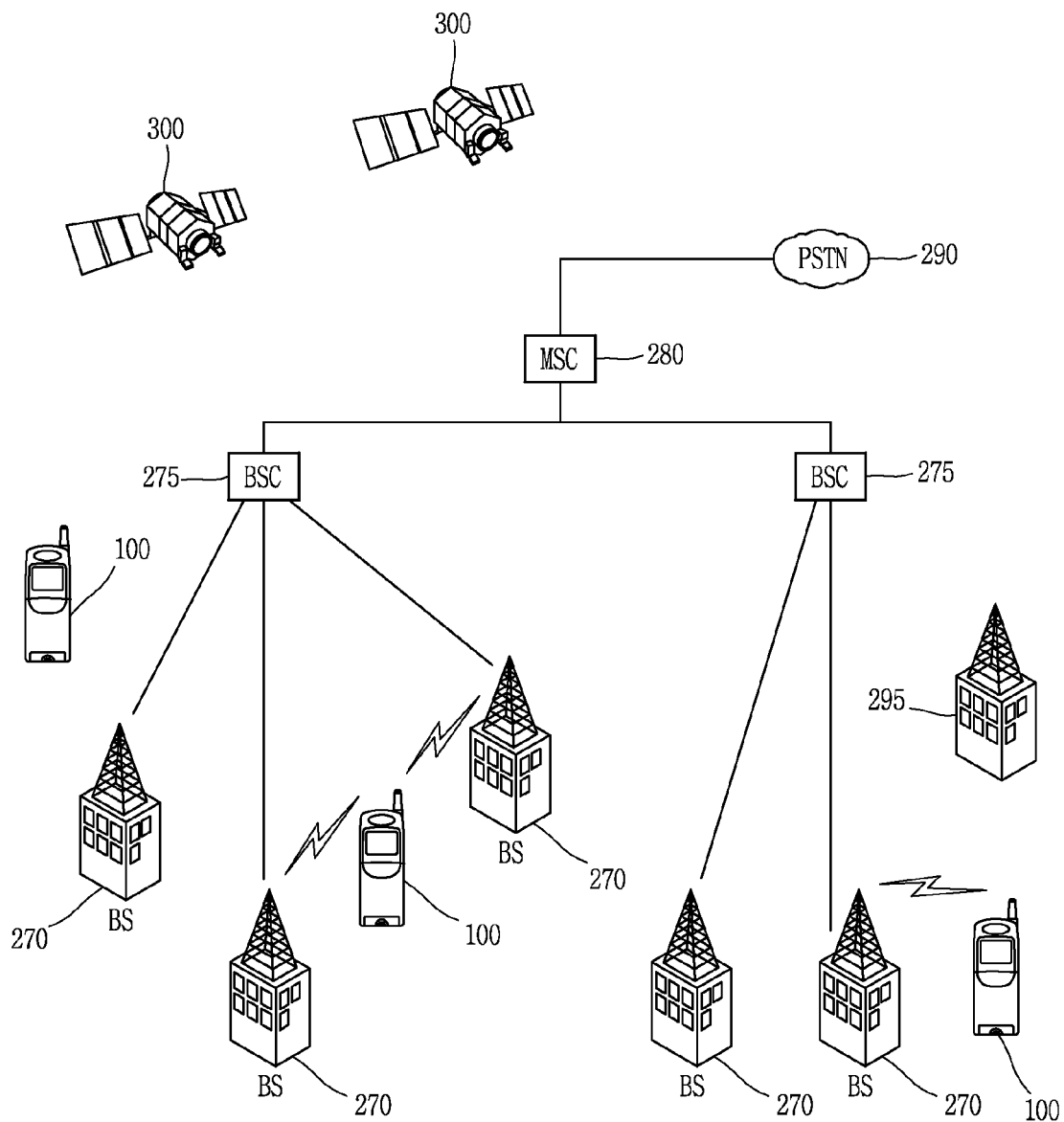
FIGS. 2A and 2B are conceptual views of communication systems in which the mobile terminal according to an embodiment of the present invention is operable.

The embodiments of the present invention will now be described with reference to the accompanying drawings, in which like numbers refer to like elements throughout although the embodiments are different, and a description of the like elements a first embodiment will be used for those of the different embodiment. In the following description, usage of suffixes such as 'module', 'part' or 'unit' used for referring to elements is given merely to facilitate explanation of the present invention, without having any significant meaning by itself. In describing the present invention, if a detailed explanation for a related known function or construction is considered to unnecessarily divert the gist of the present invention, such explanation has been omitted but would be understood by those skilled in the art. The accompanying drawings of the present invention aim to facilitate understanding of the present invention and should not be construed as limited to the accompanying drawings.

Mobile terminals described in the present disclosure may include mobile phones, smart phones, notebook computers, tablet computers, digital broadcast receivers, PDAs (Personal Digital Assistants), PMPs (Portable Multimedia Player), navigation devices, slate PCs, tablet PCs, ultra-books, and the like. However, it would be understood by a person skilled in the art that the configuration according to embodiments of the present invention can be also applicable to the fixed types of terminals such as digital TVs, desk top computers, and the like, except for any elements especially configured for a mobile purpose.

FIG. 1 is a block diagram of a mobile terminal according to an embodiment of the present invention.

The mobile terminal 100 may include a wireless communication unit 110, an A/V (Audio/Video) input unit 120, a user input unit 130, a sensing unit 140, an output unit 150, a memory 160, an interface unit 170, a controller 180, and a battery 191, etc. FIG. 1 shows the mobile terminal as having various components, but it should be understood that implementing all of the illustrated components is not a requirement. Greater or fewer components may alternatively be implemented.

The elements of the mobile terminal will be described in detail as follows.

The wireless communication unit 110 typically includes one or more modules allowing radio communication between the mobile terminal 100 and a wireless communication system or a network in which the mobile terminal is located. For example, the wireless communication unit may include at least one of a broadcast receiving module 111, a mobile communication module 112, a wireless Internet module 113, a short-range communication module 114, and a location information module 115.

The broadcast receiving module 111 receives broadcast signals and/or broadcast associated information from an external broadcast management server (or other network entity) via a broadcast channel.

The broadcast channel may include a satellite channel and/or a terrestrial channel. The broadcast management server may be a server that generates and transmits a broadcast signal and/or broadcast associated information or a server that receives a previously generated broadcast signal and/or broadcast associated information and transmits the same to a terminal. The broadcast signal may include a TV broadcast signal, a radio broadcast signal, a data broadcast signal, and the like. Also, the broadcast signal may further include a broadcast signal combined with a TV or radio broadcast signal.

The broadcast associated information may refer to information associated with a broadcast channel, a broadcast program or a broadcast service provider. The broadcast associated information may also be provided via a mobile communication network and, in this case, the broadcast associated information may be received by the mobile communication module 112.

The broadcast associated information may exist in various forms. For example, it may exist in the form of an electronic program guide (EPG) of digital multimedia broadcasting (DMB), electronic service guide (ESG) of digital video broadcast-handheld (DVB-H), and the like.

The broadcast receiving module 111 may be configured to receive signals broadcast by using various types of broadcast systems. In particular, the broadcast receiving module 111 may receive a digital broadcast by using a digital broadcast system such as multimedia broadcasting-terrestrial (DMB-T), digital multimedia broadcasting-satellite (DMB-S), digital video broadcast-handheld (DVB-H), the data broadcasting system known as media forward link only (MediaFLO®), integrated services digital broadcast-terrestrial (ISDB-T), etc. The broadcast receiving module 111 may be configured to be suitable for every broadcast system that provides a broadcast signal as well as the above-mentioned digital broadcast systems.

Broadcast signals and/or broadcast-associated information received via the broadcast receiving module 111 may be stored in the memory 160.

The mobile communication module 112 transmits and/or receives radio signals to and/or from at least one of a base station, an external terminal and a server. Such radio signals may include a voice call signal, a video call signal or various types of data according to text and/or multimedia message transmission and/or reception.

The wireless Internet module 113 supports wireless Internet access for the mobile terminal. This module may be internally or externally coupled to the terminal. The wireless Internet access technique implemented may include a WLAN (Wireless LAN) (Wi-Fi), Wibro (Wireless broadband), Wimax (World Interoperability for Microwave Access), HSDPA (High Speed Downlink Packet Access), or the like.

The short-range communication module 114 is a module for supporting short range communications. Some examples of short-range communication technology include Bluetooth™, Radio Frequency IDentification (RFID), Infrared Data Association (IrDA), Ultra-WideBand (UWB), ZigBee™, and the like.

The location information module 115 is a module for checking or acquiring a location (or position) of the mobile terminal. A typical example of the location information module is a GPS (Global Positioning System) or a WiFi (Wireless Fidelity) module.

With reference to FIG. 1, the A/V input unit 120 is configured to receive an audio or video signal. The NV input unit 120 may include a camera 121 and a microphone 122. The camera 121 processes image data of still pictures or video obtained by an image capture device in a video capturing mode or an image capturing mode. The processed image frames may be displayed on a display unit 151.

The image frames processed by the camera 121 may be stored in the memory 160 (or other storage medium) or transmitted via the wireless communication unit 110. Two or more cameras 121 may be provided according to the configuration of the mobile terminal.

The microphone 122 may receive sounds (audible data) via a microphone in a phone call mode, a recording mode, a voice recognition mode, and the like, and can process such sounds into audio data. The processed audio (voice) data may be converted for output into a format transmittable to a mobile communication base station via the mobile communication module 112 in case of the phone call mode. The microphone 122 may implement various types of noise canceling (or suppression) algorithms to cancel (or suppress) noise or interference generated in the course of receiving and transmitting audio signals.

The user input unit 130 may generate input data from commands entered by a user to control various operations of the mobile terminal. The user input unit 130 may include a keypad, a dome switch, a touch pad, a jog wheel, a jog switch, and the like.

The sensing unit 140 detects a current status (or state) of the mobile terminal 100 such as an opened or closed state of the mobile terminal 100, a location of the mobile terminal 100, the presence or absence of user contact with the mobile terminal 100 (i.e., touch inputs), the orientation of the mobile terminal 100, an acceleration or deceleration movement and direction of the mobile terminal 100, etc., and generates commands or signals for controlling the operation of the mobile terminal 100. For example, when the mobile terminal 100 is implemented as a slide type mobile phone, the sensing unit 140 may sense whether the slide phone is opened or closed. In addition, the sensing unit 140 can detect whether or not the battery 191 supplies power or whether or not the interface unit 170 is coupled with an external device.

As an example of the 3D sensor, the sensing unit 140 may include a proximity sensor 141, a stereoscopic touch sensing unit 142, a ultrasound sensing unit 143, and a camera sensing unit 144.

The proximity sensor 141 measures a distance between the sensing object (for example, the user's finger or stylus pen) and a detection surface to which a touch is applied using an electromagnetic field or infrared rays without a mechanical contact. The terminal may recognize which portion of a stereoscopic image has been touched by using the measured distance. In particular, when the touch screen is implemented with a capacitance type, it may be configured such that the proximity level of a sensing object is sensed by changes of an electromagnetic field according to the proximity of the sensing object to recognize a 3-dimensional touch using the proximity level.

The stereoscopic touch sensing unit 142 may be configured to sense the strength or duration time of a touch applied to the touch screen. For example, stereoscopic touch sensing unit 142 senses a user applied touch pressure, and if the applied pressure is strong, then the stereoscopic touch sensing unit 142 recognizes it as a touch for an object located farther from the touch screen.

The ultrasound sensing unit 143 may be configured to sense the location of the sensing object using ultrasound.

For example, the ultrasound sensing unit 143 may be configured with an optical sensor and a plurality of ultrasound sensors. The optical sensor may be formed to sense light, and the ultrasound sensor may be formed to sense ultrasound waves. Since light is far faster than ultrasound waves, the time for light to reach the optical sensor is far faster than the time for ultrasound waves to reach the ultrasound sensor. Accordingly, the location of the wave generating source may be calculated using a time difference between the light and ultrasound waves to reach the optical sensor.

The camera sensing unit 144 may include at least one of a camera 121, a photo sensor, and a laser sensor.

The output unit 150 is configured to provide outputs in a visual, audible, and/or tactile manner (e.g., audio signal, video signal, alarm signal, vibration signal, etc.). The output unit 150 may include the display unit 151, an audio output module 152, an alarm unit 153, a haptic module 154, and the like.

The display unit 151 may display (output) information processed in the mobile terminal 100. For example, when the mobile terminal 100 is in a phone call mode, the display unit 151 may display a User Interface (UI) or a Graphic User Interface (GUI) associated with a call or other communication (such as text messaging, multimedia file downloading, etc.). When the mobile terminal 100 is in a video call mode or image capturing mode, the display unit 151 may display a captured image and/or received image, a UI or GUI that shows videos or images and functions related thereto, and the like.

The display unit 151 may include at least one of a Liquid Crystal Display (LCD), a Thin Film Transistor-LCD (TFT-LCD), an Organic Light Emitting Diode (OLED) display, a flexible display, a three-dimensional (3D) display, and an e-ink display.

Some of them may be configured to be transparent or light-transmissive to allow viewing of the exterior, which may be called transparent displays. A typical transparent display may be, for example, a TOLED (Transparent Organic Light Emitting Diode) display, or the like. Through such configuration, the user can view an object positioned at the rear side of the terminal body through the region occupied by the display unit 151 of the terminal body.

The mobile terminal 100 may include two or more display units according to its particular desired embodiment. For example, a plurality of display units may be separately or integrally disposed on one surface of the mobile terminal, or may be separately disposed on mutually different surfaces.

Also, the display unit 151 may be configured as a stereoscopic display unit displaying a stereoscopic image.

Here, the stereoscopic image may be a three-dimensional (3D) stereoscopic image. The 3D stereoscopic image is an image that refers to an image making a viewer feel that a gradual depth and reality of an object on a monitor or a screen is the same as a reality space. A 3D stereoscopic image is implemented by using binocular disparity. Binocular disparity refers to disparity made by the positions of two eyes. When two eyes view different 2D images, the images are transferred to the brain through the retina and combined in the brain to provide the perception of depth and reality sense.

The stereoscopic display unit may employ a stereoscopic display scheme such as stereoscopic scheme (glass scheme), an auto-stereoscopic scheme (glassless scheme), a projection scheme (holographic scheme), or the like. Stereoscopic schemes commonly used for home television receivers, or the like, include the stereoscopic scheme, or the like.

The auto-stereoscopic scheme includes, for example, a parallax barrier scheme, a lenticular scheme, an integral imaging scheme, or the like. The projection scheme includes a reflective holographic scheme, a transmissive holographic scheme, or the like.

In general, a 3D stereoscopic image is comprised of a left image (a left eye image) and a right image (a right eye image). According to how left and right images are combined into a 3D stereoscopic image, the 3D stereoscopic imaging method is divided into a top-down method in which left and right images are disposed up and down in a frame, an L-to-R (left-to-right, side by side) method in which left and right images are disposed left and right in a frame, a checker board method in which fragments of left and right images are disposed in a tile form, an interlaced method in which left and right images are alternately disposed by columns and rows, and a time sequential (or frame by frame) method in which left and right images are alternately displayed by time.

Also, as for a 3D thumbnail image, a left image thumbnail and a right image thumbnail are generated from a left image and a right image of the original image frame, respectively, and then combined to generate a single 3D thumbnail image. In general, thumbnail refers to a reduced image or a reduced still image. The thusly generated left image thumbnail and the right image thumbnail are displayed with a horizontal distance difference therebetween by a depth corresponding to the disparity between the left image and the right image on the screen, providing a stereoscopic space sense.

A left image and a right image required for implementing a 3D stereoscopic image is displayed on the stereoscopic display unit by a stereoscopic processing unit. The stereoscopic processing unit may receive the 3D image and extract the left image and the right image, or may receive the 2D image and change it into a left image and a right image.

Meanwhile, when the display unit 151 and a sensor (referred to as a 'touch sensor', hereinafter) for detecting a touch operation are overlaid in a layered manner to form a touch screen, the display unit 151 may function as both an input device and an output device. The touch sensor may have a form of a touch film, a touch sheet, a touch pad, and the like.

The touch sensor may be configured to convert pressure applied to a particular portion of the display unit 151 or a change in the capacitance or the like generated at a particular portion of the display unit 151 into an electrical input signal.

The touch sensor may be configured to detect the pressure when a touch is applied, as well as the touched position and area.

When there is a touch input with respect to the touch sensor, a corresponding signal (signals) are transmitted to a touch controller. The touch controller processes the signals and transmits corresponding data to the controller 180. Accordingly, the controller 180 may recognize which portion of the display unit 151 has been touched.

With reference to FIG. 1, a proximity sensor 141 may be disposed within or near the touch screen. The proximity sensor 141 is a sensor for detecting the presence or absence of an object relative to a certain detection surface or an object that exists nearby by using the force of electromagnetism or infrared rays without a physical contact. Thus, the proximity sensor 141 has a considerably longer life span compared with a contact type sensor, and it can be utilized for various purposes.

Examples of the proximity sensor 141 may include a transmission type photoelectric sensor, a direct reflection type photoelectric sensor, a mirror-reflection type photoelectric sensor, an RF oscillation type proximity sensor, a capacitance type proximity sensor, a magnetic proximity sensor, an infrared proximity sensor, and the like. In case where the touch screen is the capacitance type, proximity of the pointer is detected by a change in electric field according to the proximity of the pointer. In this case, the touch screen (touch sensor) may be classified as a proximity sensor.

In the following description, for the sake of brevity, recognition of the pointer positioned to be close to the touch screen will be called a 'proximity touch', while recognition of actual contacting of the pointer on the touch screen will be called a 'contact touch'. In this case, when the pointer is in the state of the proximity touch, it means that the pointer is positioned to correspond vertically to the touch screen.

By employing the proximity sensor 141, a proximity touch and a proximity touch pattern (e.g., a proximity touch distance, a proximity touch speed, a proximity touch time, a proximity touch position, a proximity touch movement state, or the like) can be detected, and information corresponding to the detected proximity touch operation and the proximity touch pattern can be outputted to the touch screen.

When a touch sensor is overlaid on the stereoscopic display unit in a layered manner, or when the stereoscopic display unit and a 3D sensor sensing a touch operation are combined, the stereoscopic display unit may also be used as a 3D input device.

Such as the sensing unit 140 may include a proximity sensor 141, a stereoscopic touch sensing unit 142, an ultrasonic sensing unit 143, and a camera sensing unit 144.

The proximity sensor 141 detects the distance between a sensing object (e.g., the user's finger or a stylus) applying a touch by using the force of electromagnetism or infrared rays without a mechanical contact and a detect surface. By using the distance, the terminal recognizes which portion of a stereoscopic image has been touched. In particular, when the touch screen is an electrostatic touch screen, the degree of proximity of the sensing object is detected based on a change of an electric field according to proximity of the sensing object, and a touch to the 3D image is recognized by using the degree of proximity.

The stereoscopic touch sensing unit 142 is configured to detect the strength or duration of a touch applied to the touch screen. For example, the stereoscopic touch sensing unit 142 senses pressure applying a touch, and the applied pressure is strong, the stereoscopic touch sensing unit 142 recognizes the touch as a touch with respect to an object positioned to be farther from the touch screen toward the inward of the terminal.

The ultrasonic sensing unit 143 is configured to recognize position information of the sensing object by using ultrasonic waves.

The ultrasonic sensing unit 143 may include, for example, an optical sensor and a plurality of ultrasonic sensors. The optical sensor is configured to sense light, and the ultrasonic sensors may be configured to sense ultrasonic waves. Since light is very faster than ultrasonic waves, light reaches the optical sensor very earlier than ultrasonic waves reach the ultrasonic sensors. Thus, based on light as a reference signal, a position of a wave generation source may be calculated by using a time difference between a time at which light reaches the optical sensor and a time at which ultrasonic waves reach the ultrasonic sensors.

The camera sensing unit 144 includes at least one of a camera, a photo sensor, and a laser sensor.

For example, the camera and the laser sensor may be combined to detect a touch of the sensing object with respect to a 3D stereoscopic image. When distance information detected by a laser sensor is added to a 2D image captured by the camera, 3D information can be obtained.

In another example, a photo sensor may be laminated on the display unit 151. The photo sensor is configured to scan a movement of the sensing object in proximity to the touch screen. In detail, the photo sensor includes photo diodes and transistors at rows and columns to scan content mounted on the photo sensor by using an electrical signal changing according to the quantity of applied light. Namely, the photo sensor calculates the coordinates of the sensing object according to variation of light to thus obtain position information of the sensing object.

The audio output module 152 may convert and output as sound audio data received from the wireless communication unit 110 or stored in the memory 160 in a call signal reception mode, a call mode, a record mode, a voice recognition mode, a broadcast reception mode, and the like. Also, the audio output module 152 may provide audible outputs related to a particular function performed by the mobile terminal 100 (e.g., a call signal reception sound, a message reception sound, etc.). The audio output module 152 may include a speaker, a buzzer, or other sound generating device.

The alarm unit 153 outputs a signal for informing about an occurrence of an event of the mobile terminal 100. Events generated in the mobile terminal may include call signal reception, message reception, key signal inputs, a touch input etc. In addition to video or audio signals, the alarm unit 153 may output signals in a different manner, for example, to inform about an occurrence of an event. The video or audio signals may be also outputted via the audio output module 152, so the display unit 151 and the audio output module 152 may be classified as parts of the alarm unit 153.

A haptic module 154 generates various tactile effects the user may feel. A typical example of the tactile effects generated by the haptic module 154 is vibration. The strength and pattern of the haptic module 154 can be controlled. For example, different vibrations may be combined to be outputted or sequentially outputted.

Besides vibration, the haptic module 154 may generate various other tactile effects such as an effect by stimulation such as a pin arrangement vertically moving with respect to a contact skin, a spray force or suction force of air through a jet orifice or a suction opening, a contact on the skin, a contact of an electrode, electrostatic force, etc., an effect by reproducing the sense of cold and warmth using an element that can absorb or generate heat.

The haptic module 154 may be implemented to allow the user to feel a tactile effect through a muscle sensation such as fingers or arm of the user, as well as transferring the tactile effect through a direct contact. Two or more haptic modules 155 may be provided according to the configuration of the mobile terminal 100.

The memory 160 may store software programs used for the processing and controlling operations performed by the controller 180, or may temporarily store data (e.g., a phonebook, messages, still images, video, etc.) that are inputted or outputted. In addition, the memory 160 may store data regarding various patterns of vibrations and audio signals outputted when a touch is inputted to the touch screen.

The memory 160 may include at least one type of storage medium including a Flash memory, a hard disk, a multimedia card micro type, a card-type memory (e.g., SD or DX memory, etc), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, and an optical disk. Also, the mobile terminal 100 may be operated in relation to a web storage device that performs the storage function of the memory 160 over the Internet.

The interface unit 170 serves as an interface with every external device connected with the mobile terminal 100. For example, the external devices may transmit data to an external device, receives and transmits power to each element of the mobile terminal 100, or transmits internal data of the mobile terminal 100 to an external device. For example, the interface unit 170 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating the authority of using the mobile terminal 100 and may include a user identity module (UIM), a subscriber identity module (SIM) a universal subscriber identity module (USIM), and the like. In addition, the device having the identification module (referred to as 'identifying device', hereinafter) may take the form of a smart card. Accordingly, the identifying device may be connected with the terminal 100 via a port.

When the mobile terminal 100 is connected with an external cradle, the interface unit 170 may serve as a passage to allow power from the cradle to be supplied to the mobile terminal 100 or may serve as a passage to allow various command signals input by the user from the cradle to be transferred to the mobile terminal. Various command signals or power input from the cradle may operate as signals for recognizing that the mobile terminal is properly mounted on the cradle.

The controller 180 typically controls the general operations of the mobile terminal. For example, the controller 180 performs controlling and processing associated with voice calls, data communications, video calls, and the like. The controller 180 may include a multimedia module 181 for reproducing multimedia data. The multimedia module 181 may be configured within the controller 180 or may be configured to be separated from the controller 180.

The controller 180 may perform a pattern recognition processing to recognize a handwriting input or a picture drawing input performed on the touch screen as characters or images, respectively.

Also, when a state of the mobile terminal satisfies pre-set conditions, the controller 180 may execute a locked state for limiting an input of a control command of the user. Also, in the locked state, the controller 180 may control a locked screen displayed in the locked state on the basis of a touch input sensed through the display unit 151.

The battery 191 receives external power or internal power and supplies appropriate power required for operating respective elements and components under the control of the controller 180.

Various embodiments described herein may be implemented in a computer-readable or its similar medium using, for example, software, hardware, or any combination thereof.

For hardware implementation, the embodiments described herein may be implemented by using at least one of application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic units designed to perform the functions described herein. In some cases, such embodiments may be implemented by the controller 180 itself.

For software implementation, the embodiments such as procedures or functions described herein may be implemented by separate software modules. Each software module may perform one or more functions or operations described herein.

Software codes can be implemented by a software application written in any suitable programming language. The software codes may be stored in the memory 160 and executed by the controller 180.

Hereinafter, a communication system implementable through the mobile terminal 100 according to an embodiment of the present invention will be described.

Figure 2B:
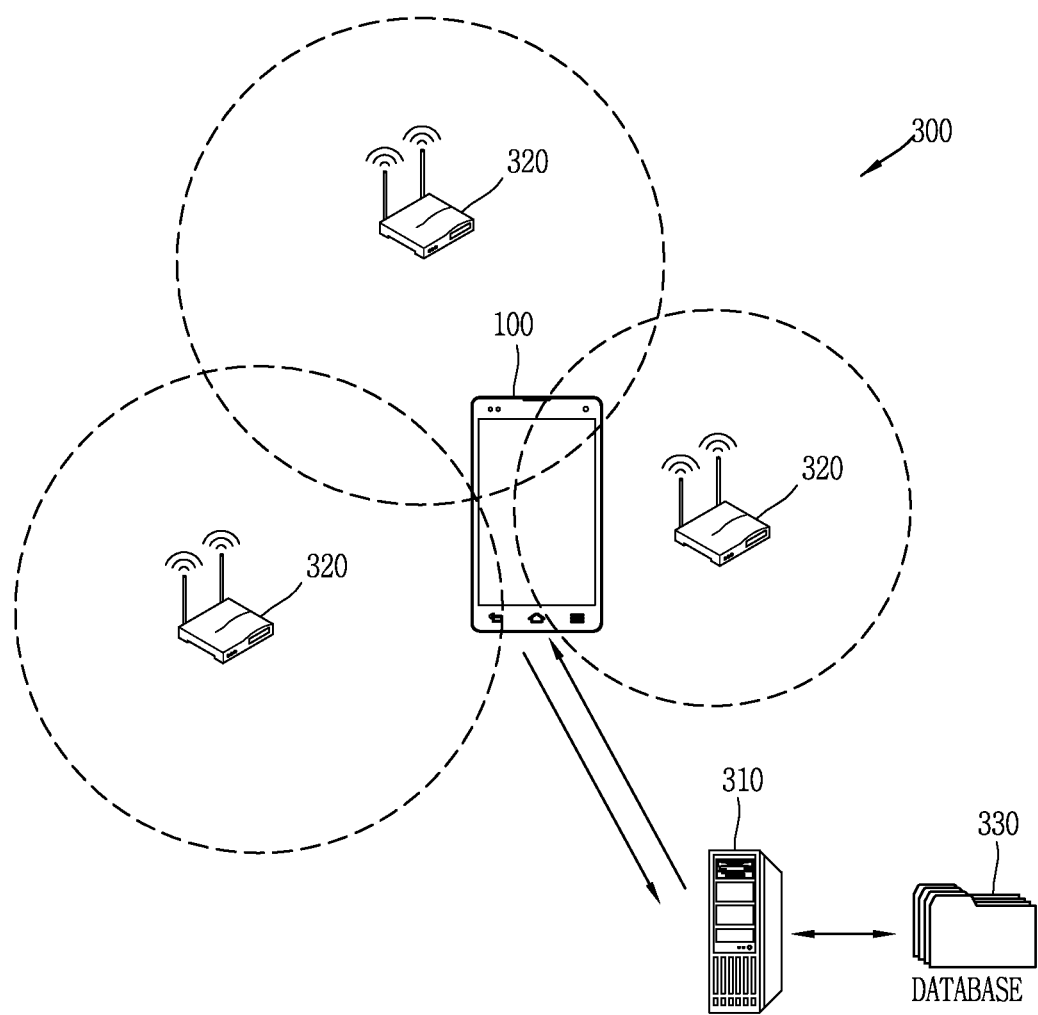

FIGS. 2A and 2B are conceptual views of communication systems in which the mobile terminal 100 according to an embodiment of the present invention is operable.

First, referring to FIG. 2A, a communication system may use different air interfaces and/or physical layers. For example, air interfaces utilized by the communication systems include example, frequency division multiple access (FDMA), time division multiple access (TDMA), code division multiple access (CDMA), and universal mobile telecommunications system (UMTS) (in particular, long term evolution (LTE)), global system for mobile communications (GSM), and the like. As a non-limiting example, the description hereafter relates to a CDMA communication system, but such teachings apply equally to other types of systems.

Hereinafter, for the description purpose, CDMA will be described, but, obviously, the present invention is applicable to any communication system including a CDMA wireless communication system.

Referring to FIG. 2, a CDMA wireless communication system may include a plurality of mobile terminals 100, a plurality of base stations (BSs) 270, base station controllers (BSCs) 275, and a mobile switching center (MSC) 280. The MSC 280 is configured to interface with a public switch telephone network (PSTN) 290. The MSC 280 is also configured to interface with the BSCs 275, which may be coupled to the base stations 270 via backhaul lines. The backhaul lines may be configured in accordance with any of several known interfaces including, for example, E1/T1, ATM, IP, PPP, Frame Relay, HDSL, ADSL, or xDSL. It is to be understood that the system as shown in FIG. 2 may include a plurality of BSCs 275.

Each BS 270 may serve one or more sectors (or regions), each sector covered by an omni-directional antenna or an antenna pointed in a particular direction radially away from the BS 270. Alternatively, each sector may be covered by two or more antennas for diversity reception. Each BS 270 may be configured to support a plurality of frequency assignments, and each frequency assignment has a particular spectrum (e.g., 1.25 MHz, 5 MHz, etc).

The intersection of a sector and frequency assignment may be referred to as a CDMA channel. The BS 270 may also be referred to as base station transceiver subsystems (BTSs) or other equivalent terms. In such case, the term "base station" may be used to collectively refer to a single BSC 275 and at least one BS 270. The base station may also be referred to as a "cell site". Alternatively, individual sectors of a particular BS 270 may be referred to as a plurality of cell sites.

As shown in FIG. 2A, a broadcasting transmitter (BT) 295 transmits a broadcast signal to the mobile terminals 100 operating within the system. The broadcast receiving module 111 as shown in FIG. 1 is provided at the terminal 100 to receive broadcast signals transmitted by the BT 295.

Also, in FIG. 2A, several global positioning systems (GPS) satellites 300 are shown. The satellites 300 help locate at least one of a plurality of terminals 100. In FIG. 2, several satellites 300 are depicted, but it is understood that useful positioning information may be obtained with any number of satellites. The GPS module 115 as shown in FIG. 1 is typically configured to cooperate with the satellites 300 to obtain desired positioning information. Instead of or in addition to GPS tracking techniques, other technologies that may track the location of the mobile terminals may be used. In addition, at least one of the GPS satellites 300 may selectively or additionally handle satellite DMB transmissions.

As one typical operation of the wireless communication system, the BSs 270 receive reverse-link signals from various mobile terminals 100. The mobile terminals 100 typically engaging in calls, messaging, and other types of communications. Each reverse-link signal received by a particular base station 270 is processed within the particular BS 270. The resulting data is forwarded to an associated BSC 275. The BSC provides call resource allocation and mobility management functionality including the coordination of soft handoff procedures between BSs 270. The BSCs 275 also route the received data to the MSC 280, which provides additional routing services for interfacing with the PSTN 290. Similarly, the PSTN 290 interfaces with the MSC 280, the MSC interfaces with the BSCs 275, and the BSCs 275 in turn control the BSs 270 to transmit forward-link signals to the mobile terminals 100.

Next, a method of acquiring the location information of a mobile terminal using a WiFi (Wireless Fidelity) positioning system (WPS) will be described with reference to FIG. 2B.

The WiFi positioning system (WPS) 300 refers to a location determination technology based on a wireless local area network (WLAN) using WiFi as a technology for tracking the location of the mobile terminal 100 using a WiFi module provided in the mobile terminal 100 and a wireless access point (AP) 320 for transmitting and receiving to and from the WiFi module.

The WiFi positioning system 300 may include a WiFi location determination server 310, a mobile terminal 100, a wireless AP 320 connected to the mobile terminal 100, and a database 330 stored with any wireless AP information.

The WiFi location determination server 310 extracts the information of the wireless AP 320 connected to the mobile terminal 100 based on a location information request message (or signal) of the mobile terminal 100. The information of the wireless AP 320 may be transmitted to the WiFi location determination server 310 through the mobile terminal 100 or transmitted to the WiFi location determination server 310 from the wireless AP 320.

The information of the wireless AP extracted based on the location information request message of the mobile terminal 100 may be at least one of MAC address, SSID, RSSI, channel information, privacy, network type, signal strength and noise strength.

The WiFi location determination server 310 receives the information of the wireless AP 320 connected to the mobile terminal 100 as described above, and compares the received wireless AP 320 information with information contained in the pre-established database 330 to extract (or analyze) the location information of the mobile terminal 100.

On the other hand, referring to FIG. 2B, as an example, the wireless AP connected to the mobile terminal 100 is illustrated as a first, a second, and a third wireless AP 320. However, the number of wireless APs connected to the mobile terminal 100 may be changed in various ways according to a wireless communication environment in which the mobile terminal 100 is located. When the mobile terminal 100 is connected to at least one of wireless APs, the WiFi positioning system 300 can track the location of the mobile terminal 100.

Next, considering the database 330 stored with any wireless AP information in more detail, various information of any wireless APs disposed at different locations may be stored in the database 330.

The information of any wireless APs stored in the database 330 may be information such as MAC address, SSID, RSSI, channel information, privacy, network type, latitude and longitude coordinate, building at which the wireless AP is located, floor number, detailed indoor location information (GPS coordinate available), AP owner's address, phone number, and the like.

In this manner, any wireless AP information and location information corresponding to the any wireless AP are stored together in the database 330, and thus the WiFi location determination server 310 may retrieve wireless AP information corresponding to the information of the wireless AP 320 connected to the mobile terminal 100 from the database 330 to extract the location information matched to the searched wireless AP, thereby extracting the location information of the mobile terminal 100.

Furthermore, the extracted location information of the mobile terminal 100 may be transmitted to the mobile terminal 100 through the WiFi location determination server 310, thereby acquiring the location information of the mobile terminal 100.

Hereinafter, a mobile terminal according to an embodiment of the present disclosure as illustrated in FIG. 1 or a mobile terminal disposed with the constituent elements of the mobile terminal or the structure of a mobile terminal will be described.

Figure 3A:
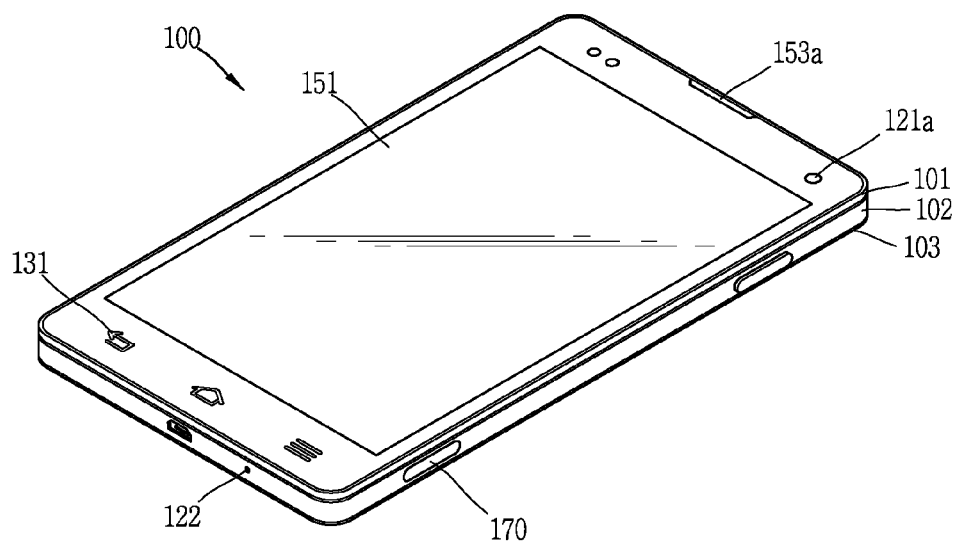
FIG. 3A is a front perspective view of the mobile terminal related to the present invention.

FIG. 3A is a front perspective view illustrating an example of the mobile terminal 100 associated with the present disclosure.

The mobile terminal 100 disclosed herein is provided with a bar-type terminal body. However, the present invention may not be limited to this, but also may be applicable to various structures such as watch type, clip type, glasses type or folder type, flip type, swing type, swivel type, or the like, in which two and more bodies are combined with each other in a relatively movable manner.

The terminal body includes a case (casing, housing, cover, etc.) forming the appearance of the terminal. In this embodiment, the case may be divided into a front case 101 and a rear case 102. Various electronic components are incorporated into a space formed between the front case 101 and the rear case 102. At least one middle case may be additionally disposed between the front case 101 and the rear case 102, and a battery cover 103 for covering the battery 191 may be detachably configured at the rear case 102.

The cases may be formed by injection-molding a synthetic resin or may be also formed of a metal, for example, stainless steel (STS), titanium (Ti), or the like.

A display unit 151, a first audio output module 153a, a first camera 121a, a first manipulating unit 131 and the like may be disposed on a front surface of the terminal body, and a microphone 122, an interface unit 170, a second manipulating unit 132 and the like may be provided on a lateral surface thereof.

The display unit 151 may be configured to display (output) information being processed in the mobile terminal 100. The display unit 151 may include at least one of a liquid crystal display (LCD), a thin film transistor-liquid crystal display (TFT-LCD), an organic light emitting diode (OLED) display, a flexible display, a 3-dimensional (3D) display, and an e-ink display.

The display unit 151 may include a sensing unit 140 to receive a control command by a touch method. When a touch is made to any one place on the display unit 151, the sensing unit 140 may be configured to sense this touch and enter the content corresponding to the touched place. The content entered by a touch method may be a text or numerical value, or a menu item capable of indication or designation in various modes.

The sensing unit 140 may be formed with transparency to allow visual information displayed on the display unit 151 to be seen, and may include a structure for enhancing the visibility of a touch screen at bright places. Referring to FIG. 3A, the display unit 151 occupies most of the front surface of the front case 101.

The first audio output module 153a and the first camera 121a are disposed in a region adjacent to one of both ends of the display unit 151, and the first manipulation input unit 131 and the microphone 122 are disposed in a region adjacent to the other end thereof. The second manipulation unit 132 (refer to FIG. 3B), the interface 170, and the like, may be disposed on a lateral surface of the terminal body.

The first audio output module 153a may be implemented in the form of a receiver for transferring voice sounds to the user's ear or a loud speaker for outputting various alarm sounds or multimedia reproduction sounds.

It may be configured such that the sounds generated from the first audio output module 153a are released along an assembly gap between the structural bodies. In this case, a hole independently formed to output audio sounds may not be seen or hidden in terms of appearance, thereby further simplifying the appearance of the mobile terminal 100. However, the present invention may not be limited to this, but a hole for releasing the sounds may be formed on the window.

The first camera 121a processes video frames such as still or moving images obtained by the image sensor in a video call mode or capture mode. The processed video frames may be displayed on the display unit 151.

The user input unit 130 is manipulated to receive a command for controlling the operation of the mobile terminal 100. The user input unit 130 may include a first and a second manipulation unit 131, 132. The first and the second manipulation unit 131, 132 may be commonly referred to as a manipulating portion, and any method may be employed if it is a tactile manner allowing the user to perform manipulation with a tactile feeling such as touch, push, scroll or the like.

In the present embodiment, it is illustrated on the basis that the first manipulation unit 131 is a touch key, but the invention may not be necessarily limited to this. For example, the first manipulation unit 131 may be configured with a mechanical key, or a combination of a touch key and a mechanical key.

The content received by the first and/or second manipulation units 131, 132 may be set in various ways. For example, the first manipulation unit 131 may be used to receive a command such as menu, home key, cancel, search, or the like, and the second manipulation unit 132 may receive a command, such as controlling a volume level being outputted from the first audio output module 153a, or switching into a touch recognition mode of the display unit 151.

The microphone 122 may be formed to receive the user's voice, other sounds, or the like. The microphone 122 may be provided at a plurality of places, and configured to receive stereo sounds.

The interface unit 170 serves as a path allowing the mobile terminal 100 to exchange data with external devices. For example, the interface unit 170 may be at least one of a connection terminal for connecting to an earphone in a wired or wireless manner, a port for near field communication (for example, an Infrared Data Association (IrDA) port, a Bluetooth port, a wireless LAN port, and the like), and a power supply terminal for supplying power to the mobile terminal 100. The interface unit 170 may be implemented in the form of a socket for accommodating an external card such as Subscriber Identification Module (SIM) or User Identity Module (UIM), and a memory card for information storage.

Figure 3B:
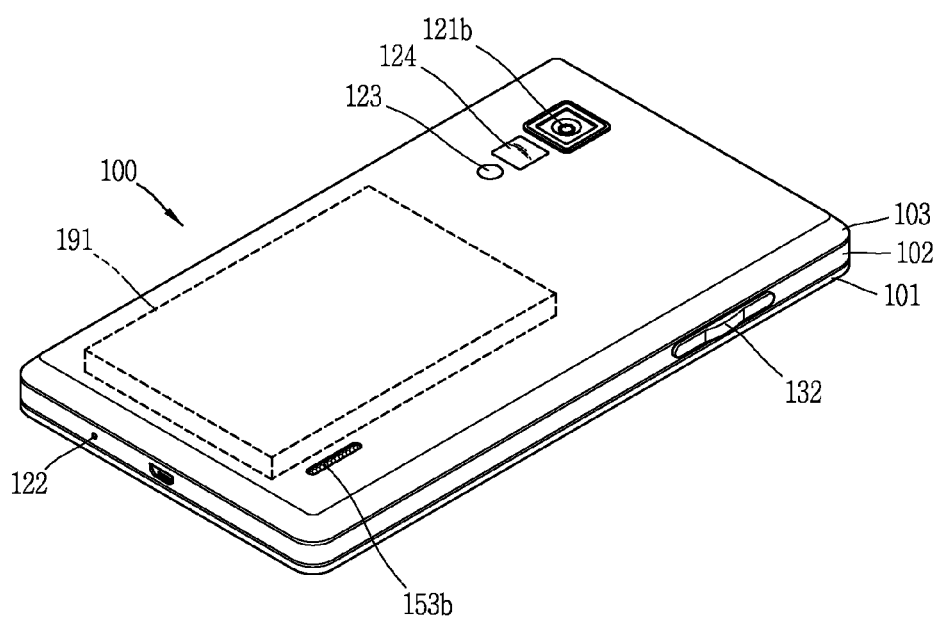
FIG. 3B is a rear perspective view of the mobile terminal illustrated in FIG. 3A.

FIG. 3B is a rear perspective view illustrating mobile terminal 100 illustrated in FIG. 3A.

Referring to FIG. 3B, a second camera 121b may be additionally mounted at a rear surface of the terminal body, namely, the rear case 102. The second camera 121b has an image capturing direction, which is substantially opposite to the direction of the first camera unit 121a (refer to FIG. 3A), and may have a different number of pixels from that of the first camera unit 121a.

For example, it is preferable that the first camera 121a has a relatively small number of pixels enough not to cause difficulty when the user captures his or her own face and sends it to the other party during a video call or the like, and the second camera 121b has a relatively large number of pixels since the user often captures a general object that is not sent immediately. The first and the second camera 121a, 121b may be provided in the terminal body in a rotatable and pop-up manner.

A flash 123 and a mirror 124 may be additionally disposed adjacent to the second camera 121b. The flash 123 illuminates light toward an object when capturing the object with the second camera 121b. The mirror 124 allows the user to look at his or her own face, or the like, in a reflected way when capturing himself or herself (in a self-portrait mode) by using the second camera 121b.

A second audio output module 153b may be additionally disposed at a rear surface of the terminal body. The second audio output module 153b together with the first audio output module 153a (refer to FIG. 3A) can implement a stereo function, and may be also used to implement a speaker phone mode during a phone call.

An antenna (not shown) for receiving broadcast signals may be additionally disposed at a lateral surface of the terminal body in addition to an antenna for making a phone call or the like. The antenna constituting part of the broadcast receiving module 111 (refer to FIG. 1) may be provided in the terminal body in a retractable manner.

A battery 191 (refer to FIG. 1) for supplying power to the mobile terminal 100 may be mounted on the terminal body. The battery 191 may be incorporated into the terminal body, or may include a battery 191 configured in a detachable manner on the outward of the terminal body. According to the drawing, it is illustrated that the battery cover 103 is combined with the rear case 102 to cover the battery 191, thereby restricting the battery 191 from being released and protecting the battery 191 from external shocks and foreign substances.

Figure 4:
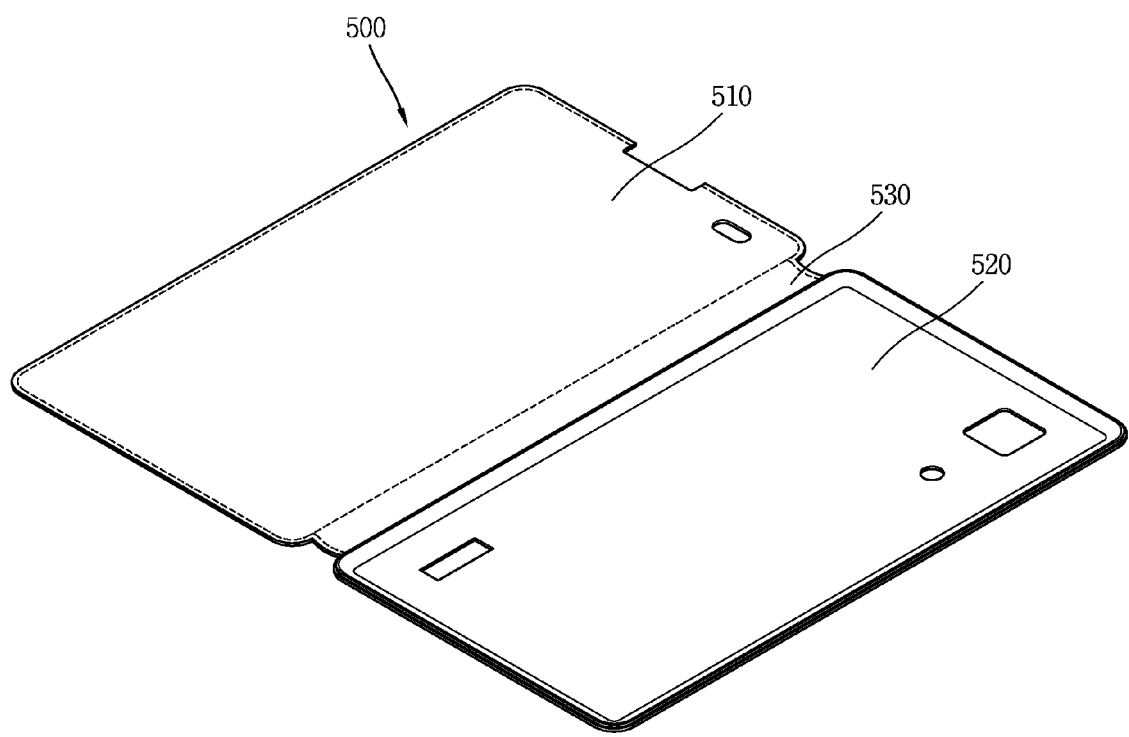
FIG. 4 is a perspective view of a cover for a mobile terminal that may be coupled to the mobile terminal.

FIG. 4 is a perspective view of a cover for a mobile terminal that may be coupled to the mobile terminal.

Referring to FIG. 4, a cover 500 according to an embodiment of the present invention includes a first member 510 and a second member 520. Also, the cover 500 includes a connection portion 530 connecting the first and second members 510 and 520. The connection portion 530 may be formed to cover a lateral surface of the mobile terminal 100, and has a structure of extending in one direction. A form of the connection portion 530 is changed according to a relative movement of the first and second members 510 and 520.

The first and second members 510 and 520 may have a plate-like shape and be formed to correspond to a front portion and a rear portion of the mobile terminal 100, respectively. The first and second members 510 and 520 may be made of a material that may be bendable or pliable. For example, the first and second members 510 and 520 and the connection portion 530 may include at least one of polyurethane, PVC, Bakelite, and corrugated cardboard, but materials used to form the first and second members 510 and 520 and the connection portion 530 are not limited thereto.

However the first and second members 510 and 520 are preferably made of a material which is not easily bent and the connection portion 530 between the first and second members 510 and 520 is made of a material which is deformable by force with which the first and second members 510 and 520 relatively move.

According to an embodiment of the present invention, when the mobile terminal is 100 installed in the cover, activation of the display unit 151 is controlled according to a movement of the first member 510. Hereinafter, a structure of the cover 500 for controlling activation of the display unit 151 of the mobile terminal 100 will be described.

FIGS. 5A through 5D are perspective views illustrating operational states of the cover 500 coupled to the mobile terminal. Referring to FIGS. 5A through 5D, the second member 520 is installed on a rear surface of the mobile terminal 100, so the rear surface of the mobile terminal 100 is not exposed. Also, in order to prevent the mobile terminal 100 from being separated from the cover 500, the second member 520 may have a fixing unit (not shown) for fixing the mobile terminal 100.

When the cover 500 is installed in the mobile terminal 100, the second member 520 is fixed to the rear surface of the mobile terminal 100, and the first member 510 may be formed to cover the display unit 151. Although not shown in detail, a fixing structure may be formed to connect end portions facing the connection portion 530 of the first and second members 510 and 520 when the mobile terminal 100 is installed.

In a state in which the first member 510 covers the display unit 151, namely, in a state in which the display unit 151 is not exposed to the outward, the controller 180 may activate the display unit 151.

For example, in a state in which the display unit 151 is activated, when the first member 510 covers the display unit 151, the controller 180 senses the covering of the display unit 151 so it deactivates the display unit 151.

Thus, the display unit 151 may be prevented from being maintained in an activated state during a pre-set period of time, and thus, power consumption according to activation of the display unit 151 can be reduced.

Figure 5A:
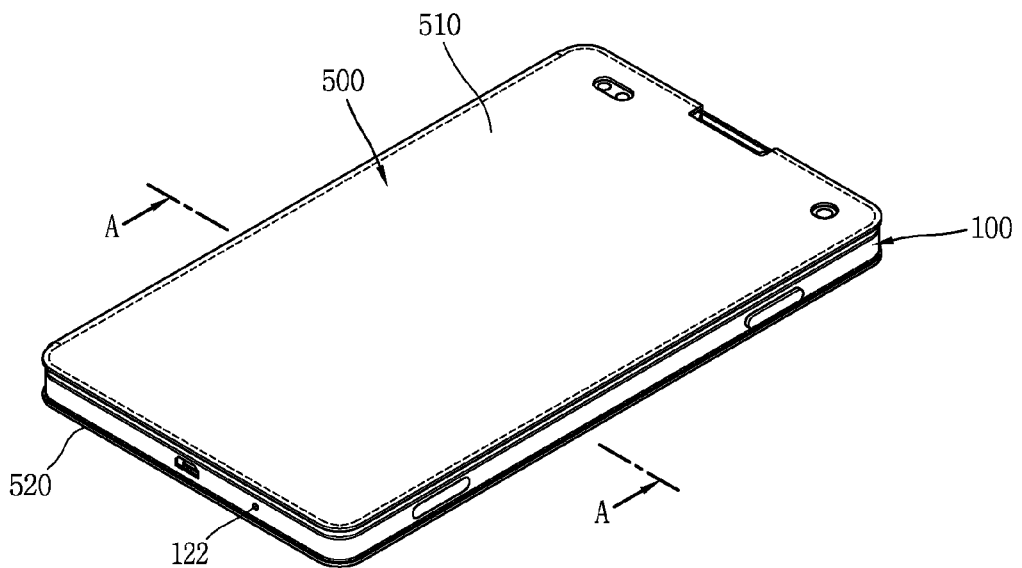
FIGS. 5A through 5D are perspective views illustrating operational states of a cover coupled to the mobile terminal.
Figure 5B:
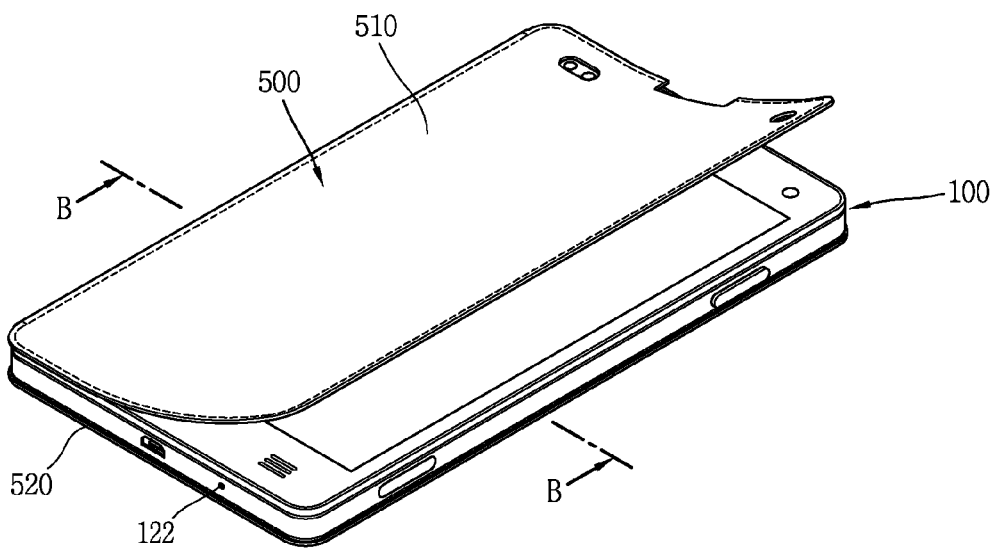
Figure 5C:
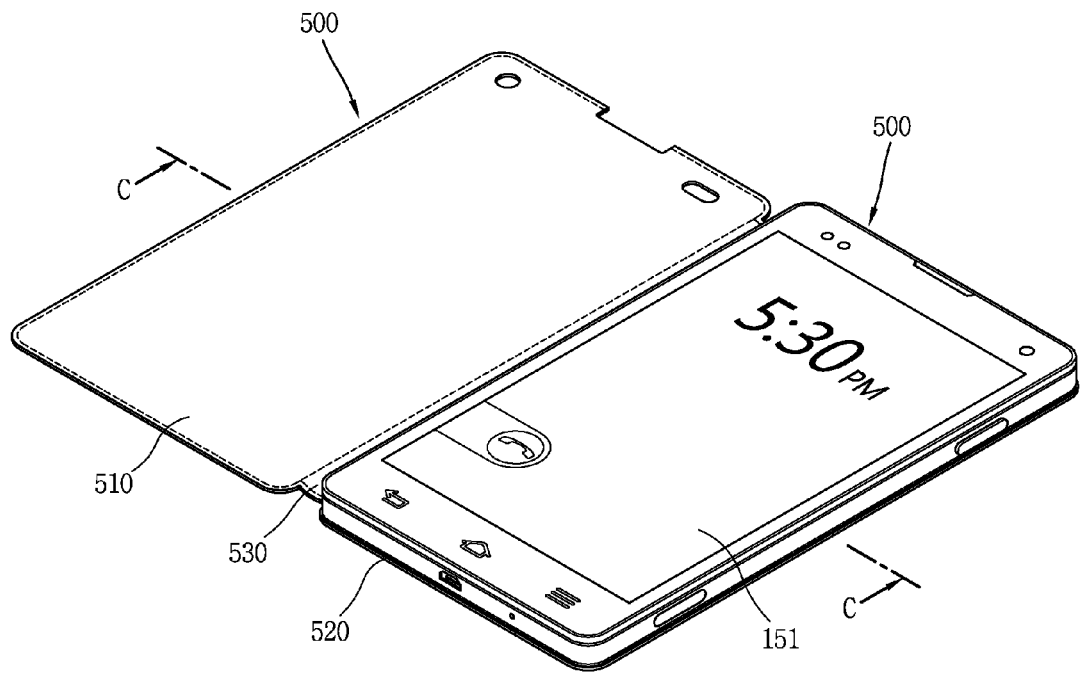
Figure 5D:
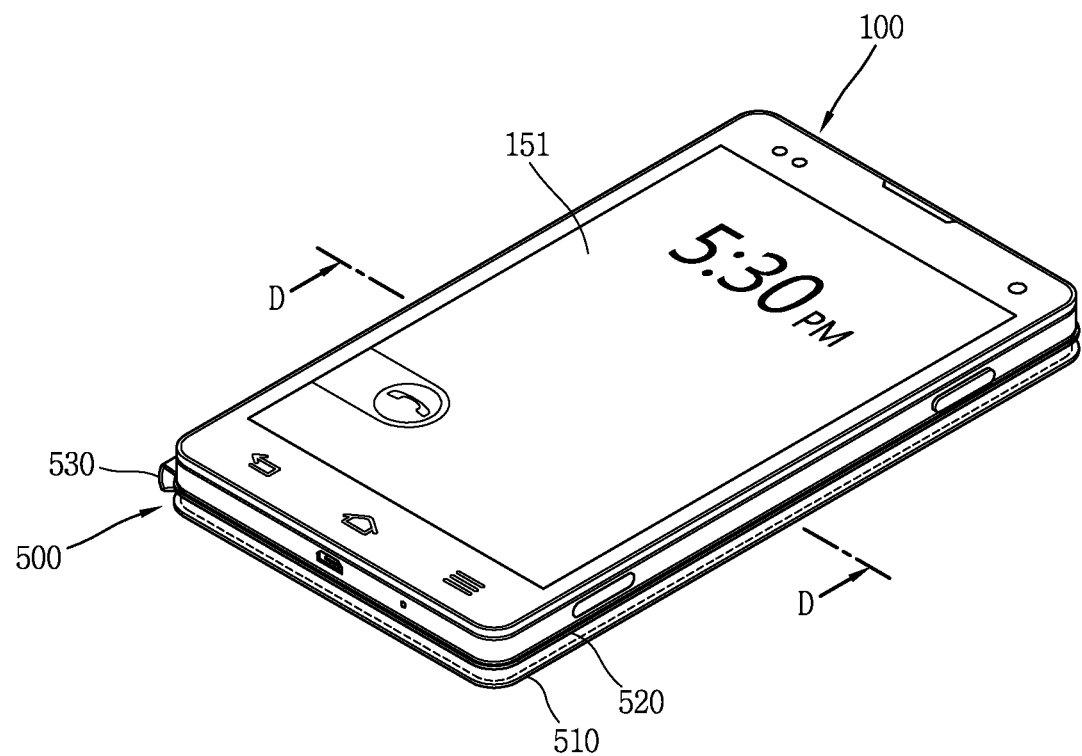

FIGS. 5B through 5D are views illustrating first to fourth embodiments of the mobile terminal 100 installed in the cover 500. When the first member 510 is moved by the user, the display unit 151 is exposed to the outward. As illustrated in FIG. 5B, the first member 510 may be bent by the user.

FIG. 5C is a view illustrating a case in which the first and second members 510 and 520 are opened, exposing a front surface of the display unit 151. FIG. 5D is a view illustrating a state in which the first member 510 and the second member 520 overlap with each other, and since the front surface of the display unit 151 is exposed, deformation of the connection portion 530 is maximized.

In the state illustrated in FIGS. 5C and 5D, the user generally uses the display unit 151.

According to an embodiment of the present invention, the first member 510 is spaced apart from a portion or the entire area of the display unit 151 to expose at least a portion of the display unit 151, the controller 180 activates the display unit 151. Namely, the controller 180 controls the display unit 151 to output pre-set screen information.

Here, deactivation refers to a state in which power is not applied to the display unit 151 no screen information is output to the display unit 151. In general, a deactivated state is controlled on the basis of a control command (in general, a control command applied to a power button) applied by the user. Also, activation refers to a state in which power is applied to the display unit 151 and pre-set screen information is output.

The screen information may correspond to a screen which is substantially the same as a screen of a case in which the display unit 151 is activated on the basis of a control command applied by the user to the mobile terminal 100, but the present invention is not limited thereto. For example, the screen information may correspond to a home screen including at least one icon to which a touch input is applied to execute an application.

Also, although not shown in detail, when a portion or the entirety of the display unit 151 is exposed by the first member 510, the display unit 151 may be controlled to be activated after a pre-set period of time (a few seconds) has lapsed since a portion or the entirety of the display unit 151 was exposed.

Thus, when the display unit 151 is opened by using the first member, the user may immediately use the activated display unit 151 without having to apply a control command for activating the display unit 151.

As illustrated in FIGS. 5A and 5C, respectively, the controller 180 may control the display unit 151 differently according to a disposition structure of the first member 510 with respect to the body of the mobile terminal 100 and a disposition structure of the first member with respect to the second member 520.

Hereinafter, a method for controlling the display unit 151 by using the first member 510 and the structure of the first member 510 will be described.

Figure 6B:
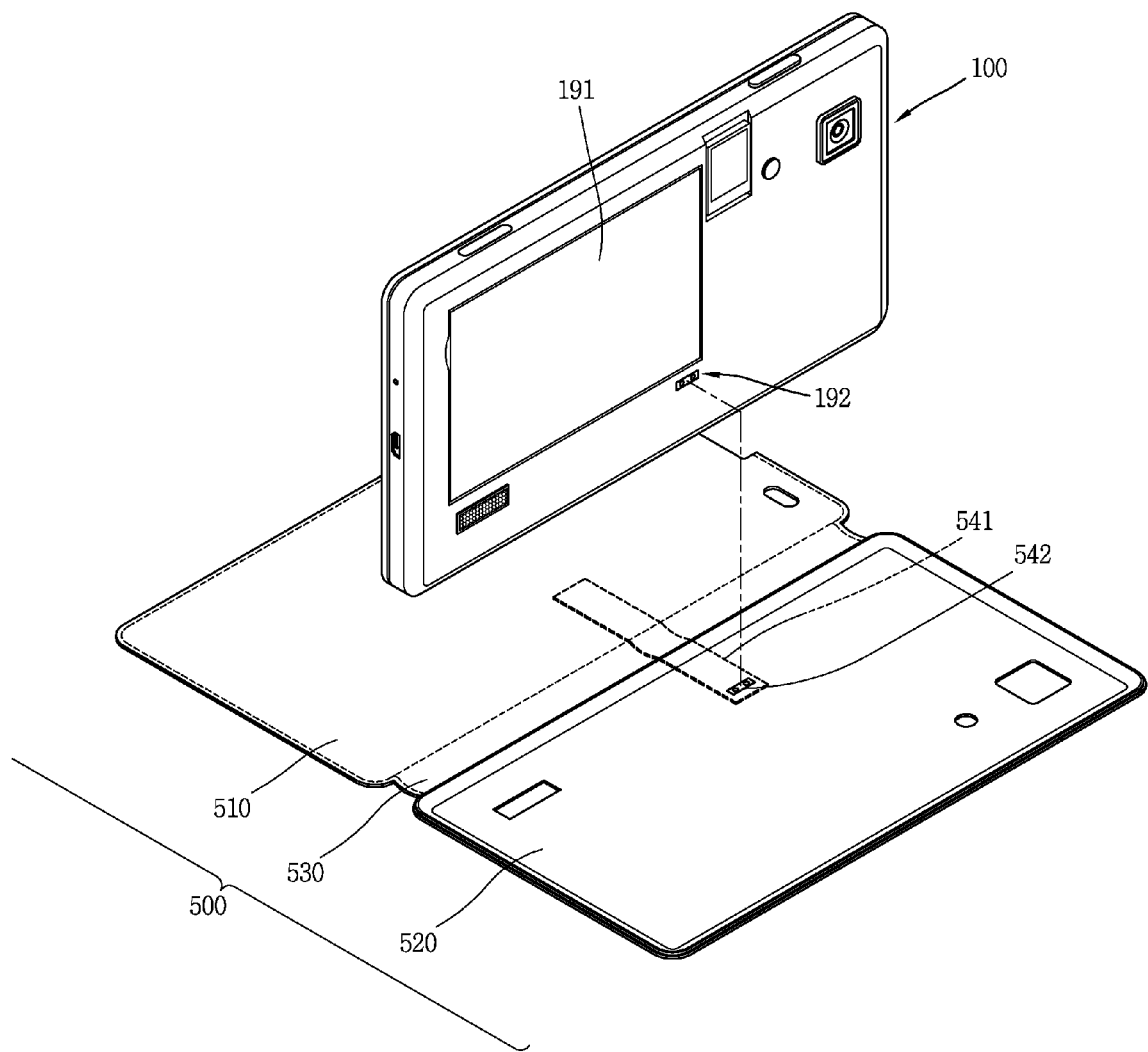
Figure 6C:
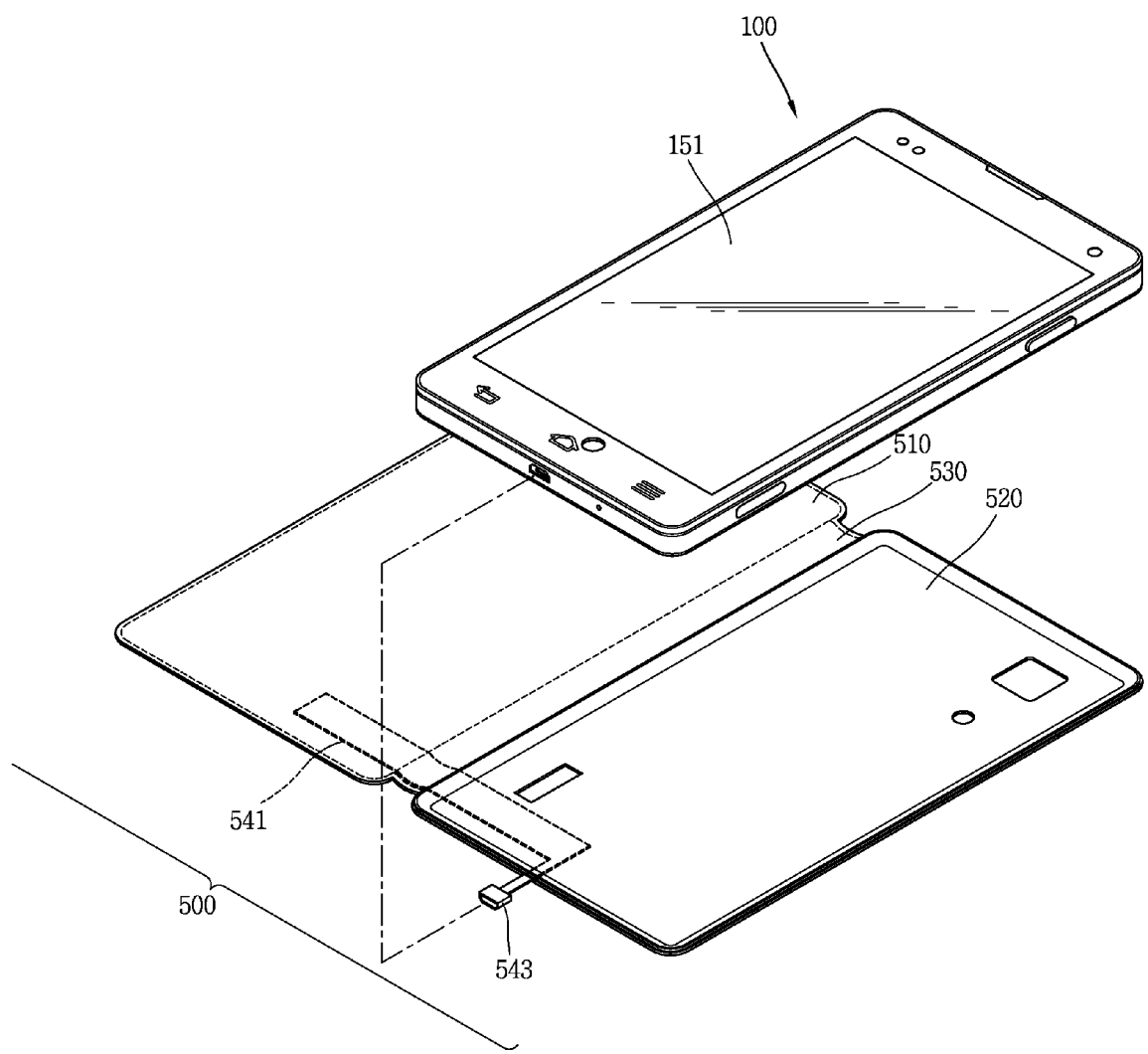

FIGS. 6A through 6C are views illustrating the cover for the mobile terminal 100 according to a first embodiment of the present invention.

In FIG. 6A, (a) is a cross-sectional view taken along line A-A in a first state of FIGS. 5A, and 6B is an exploded perspective illustrating a state in which the body of the mobile terminal 100 is separated from the cover 500 according to the first embodiment of the present invention.

According to the present embodiment, the first state may be defined as a closed state, and third and fourth states may be defined as opened states. Here, however, the second state may be defined as a closed state or opened state on the basis of a user setting.

Referring to FIGS. 6A and 6B, the mobile terminal 100 installed in the cover 500 includes the first and second members 510 and 520, the connection portion 530, and a signal generating unit for controlling the display unit 151.

The signal generating unit may detect a state of the first and second members 510 and 520 and generate a state signal to control the display unit 151. According to the present embodiment, in order to detect a state of the first and second members 510 and 520, the signal generating unit may further include a deformation sensing film 541.

The deformation sensing film 541 is integratedly formed within the first and second members 510 and 520 and the connection portion 530. For example, when the cover 500 is configured as a plurality of overlapping members, the deformation sensing film 541 may be formed between the plurality of members.

The deformation sensing film 541 may sense deformation of a portion between the first member 510 and the connection portion 530, deformation of a portion between the connection portion 530 and the second member 520, and deformation of the connection portion 530.

As illustrated in FIG. 6B, only a region of the deformation sensing film 541 may be formed to overlap with the first and second members 510 and 520 and the connection portion 530. However, the present invention is not limited thereto and the deformation sensing film 541 may be formed in the entirety of the cover.

The deformation sensing film 541 may be made of a material that generates an electrical signal due to physical deformation. For example, the deformation sensing film 541 may be formed of a piezoelectric film. The piezoelectric film generates a current according to physical pressure. In this case, different amounts of currents and currents of different signs may be generated according to an amount of deformation.

For example, referring to (a) and (b) of FIG. 6A, the deformation sensing film 541 is disposed such that a section thereof has a channel-like shape. As the first member 510 is moved, a shape of the deformation sensing film 541 is changed to be gently bent. Thus, the deformation sensing film 541 generates a current according to a degree of change in its shape.

Referring to (a) and (c) of FIG. 6A, the deformation sensing film 541 is bent in different directions and generates currents of mutually opposite signs according to the different directions.

The controller 180 controls the display unit 151 according to a current generated by the deformation sensing film 541. In order to allow the controller 180 of the mobile terminal 100 to be provided with a current from the deformation sensing film 541, a first terminal member 542 is formed on the second member 520 of the cover 500. Also, in order to allow the controller 180 to be provided with a current from the first terminal member 542, in a case in which the cover 500 and the mobile terminal 100 are combined, a contact protrusion 192 may be formed in one surface of the mobile terminal 100.

In this case, the second member 520 is installed in the rear case 102 in a state in which the battery cover 103 is separated from the mobile terminal 100.

Namely, the deformation sensing film 541 may generate a different state signal on the basis of a shape and a degree of deformation. Namely, the deformation sensing film 541 illustrated in (a) and (b) of FIG. 6A may generate different amounts of currents having the same sign.

Namely, when a change in the current is sensed based on a pre-set reference threshold, the controller 180 may selectively output a state signal indicating an opened state or a state signal indicating a closed state. According to the present embodiment, the second state may be defined as an opened state or a closed state on the basis of the reference amount of current according to a user setting. When the reference amount of current is set to be small, although only a region of the display unit 151 is exposed, it is defined as an opened state and the display unit 151 may be controlled to be activated. Meanwhile, when the reference amount of current is set as a current variation according to a change from the first state to the third state, the second state may be defined as a closed state.

Although not shown, the display unit 151 may be controlled in a different manner according to a movement of the first member 510. For example, in the third state, the controller 180 may activate the display unit 151, and in the fourth state, the controller 180 may control the display unit 151 to change current screen information to a pre-set different screen information (i.e., the controller 180 may control the display unit 151 to display a pre-set different screen information).

FIG. 6C illustrates the deformation sensing unit 541 connected to a second terminal member 543 according to another embodiment of the present invention.

The deformation sensing unit 541 may be formed to be adjacent to an end portion of the mobile terminal 100 within the cover 500. The deformation sensing unit 541 is electrically connected to the second terminal member 543 outwardly protruded from the cover 500.

The second terminal member 543 may be connected to an interface unit (not shown) of the mobile terminal 100 to provide a current. The second terminal member 543 may include a flexible printed circuit board (FPCB) and a wire member.

Thus, a state signal may be generated by using the interface unit for charging the battery 191 without having to separate the battery cover from the body of the mobile terminal 100.

According to the present embodiment, the display unit 151 may be automatically controlled according to deformation of the cover 500 without a sensing unit within the body of the mobile terminal 100. Thus, the present invention may be applicable to various types of mobile terminals 100 and efficiency of an inner space of the mobile terminal 100 can be enhanced.

Figure 7B:
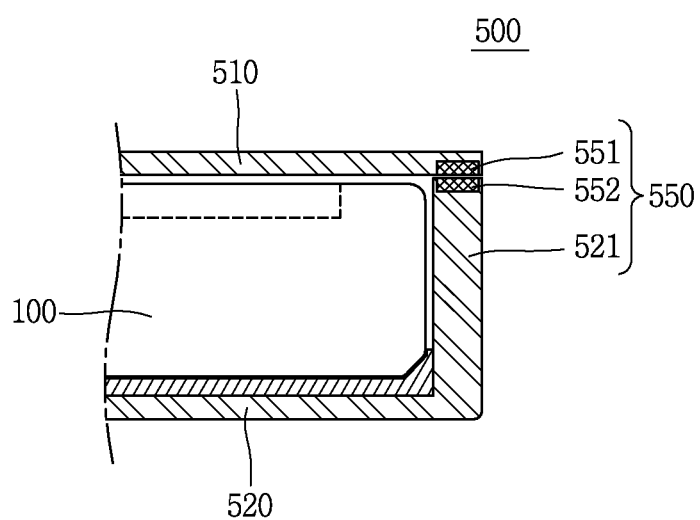
FIG. 7B is a partial cross-sectional view illustrating a first state of FIG. 7A.

FIGS. 7A and 7B are views illustrating the mobile terminal 100 installed in the cover 500 according to another embodiment of the present invention. FIG. 7A is a perspective view of the mobile terminal in the first and third states, and FIG. 7B is a partial sectional view of the mobile terminal 100 in the first state.

The cover 500 for a mobile terminal according to the present embodiment may include a sensing unit 550 having a magnet 551 and a hall sensor 552 formed in the first and second members 510 and 520, respectively. Also, the second member 520 includes a lateral cover portion 521 bent from a section of the second member 520 toward the first member 510.

The lateral cover portion 521 may be formed to have a pre-set width. Also, the first member 510 may be formed to be larger than a width of the front surface of the mobile terminal 100, and a corner of the first member 510 may be formed to overlap with the lateral cover portion 521. Thus, in the first state, the corner of the first member 510 is supported the lateral cover portion 521.

The sensing unit 550 is formed in a region of the first member 510 whose corner by the lateral cover portion 521. The magnet 551 may be formed to extend along the corner or may be formed in a partial region of the corner. The hall sensor 552 may be formed in a region corresponding to the magnet 551.

The hall sensor 552 senses a change in a magnetic field according to a movement of the first member 510. Namely, when the magnet 551 is away from the hall sensor or approaches the hall sensor 552, the hall sensor 552 senses a change in the position of the magnet 551. According to the change in magnetism, the hall sensor 522 generates a current and provides the generated current to the mobile terminal 100.

Although not shown in detail, the cover 500 may include a terminal member that transmits a signal according to a change in magnetism of the hall sensor 552 to the body of the mobile terminal 100.

According to the present embodiment, when a movement of the first member 510 from the first state to the third state is sensed, the controller 180 of the mobile terminal 100 activates the display unit 151.

Meanwhile, when the movement of the first member 510 from the third state to the first state or to the second state is sensed, the controller 180 may control the display unit 151 to be deactivated.

Since the sensing unit 550 is formed in the cover 500, an additional component is not required within the mobile terminal 100, and since the sensing unit 550 is disposed to be adjacent to the lateral surface of the mobile terminal 100, influence on wireless communication of the mobile terminal 100 can be minimized.

Figure 8:
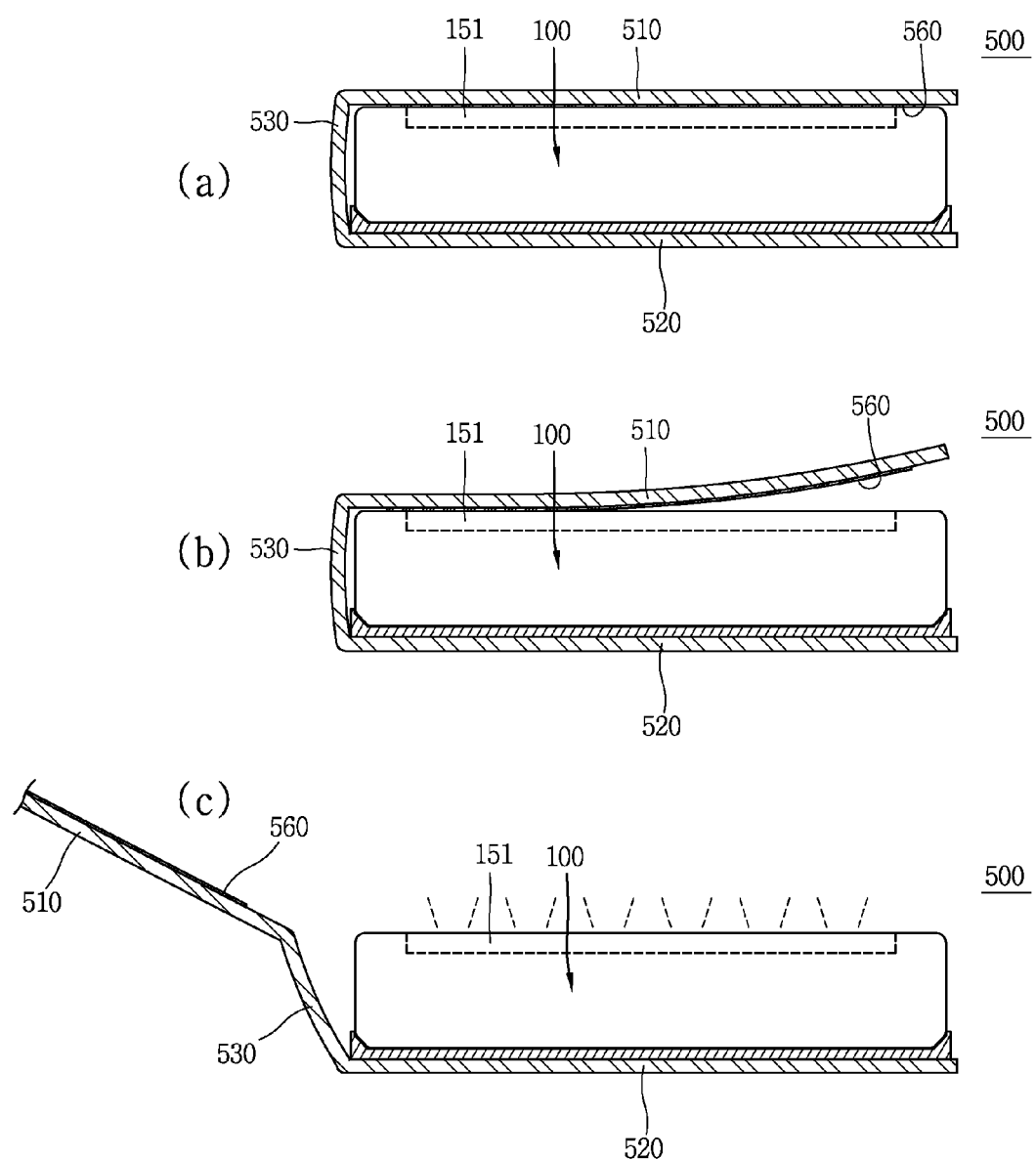
FIG. 8 is a partial cross-sectional view illustrating a cover according to another embodiment of the present invention.

FIG. 8 is a partial cross-sectional view illustrating a cover (500) according to another embodiment of the present invention. The cover according to the present embodiment includes a conductive member 560 that applies a touch input to the display unit 151 (namely, a conductive member that comes into contact with the display unit 151).

The conductive member 560 may be formed in an inner surface of the first member 510 facing the display unit 151. When the conductive member 560 comes into contact with the display unit 151, a value of a current flowing in the display unit 151 is changed. Thus, the controller 180 may generate a state signal according to a change in the current value.

When a region of the display unit 151 with which the conductive member 560 comes into contact is equal to or greater than a pre-set reference region (or when a region of the display unit 151 with which a touch input applied by the conductive member 560 is equal to or greater than the pre-set reference region), the controller 180 may deactivate the display unit 151.

In (a) of FIG. 8, since the conductive member 560 is in contact with the display unit 151, the controller 180 deactivates the display unit 151. In (b) of FIG. 8, when a region of the display unit 151 to which a touch input is applied is equal to or greater than the reference region, the controller 180 activates the display unit 151, and when a region of the display unit 151 to which a touch input is applied is smaller than the reference region, the controller 180 deactivates the display unit 151.

The reference region may be set by the user, and thus, the user may adjust a degree of exposure of the display unit 151 and a point in time at which the display unit 151 is activated.

Meanwhile, when a portion of a touch input applied to the front surface of the display unit 151 is released, the controller 180 may activate the display unit 151 and may control the display unit 151 to adjust brightness output according to a degree of release of the touch input.

When the entirety of the display unit 151 is exposed by the first member 510, the controller 180 may activate the display unit 151 and control the display unit 151 to adjust brightness thereof.

According to the present embodiment, an additional component for electrically connecting the mobile terminal 100 and the cover to transmit a state signal for controlling the display unit 151 is not necessary, and an additional component installed in the mobile terminal 100 to generate the state signal is unnecessary. Thus the structure of the cover 500 is simplified.

Also, since an amount of light emitted from the display unit 151, as well as an active state of the display unit 151, is adjustable according to a region of a touch input applied to the display unit 151, user convenience can be enhanced.

FIG. 9 is a partial cross-sectional view illustrating the mobile terminal 100 installed in a cover 500 according to another embodiment of the present invention.

According to the present embodiment, the mobile terminal 100 includes a protrusion 193 formed to be pressed in the terminal body. The protrusion 193 moves to the inward of the mobile terminal 100 by physical pressure from the outward, and when the physical pressure is released, the protrusion 193 is moved to outward of the mobile terminal 100.

The protrusion 193 may be formed on a lateral surface of the mobile terminal 100 covered by the connection portion 530. According to a movement of the first member 510, the connection portion 530 is moved and deformed on the basis of the body of the mobile terminal 100.

Also, the connection portion 530 includes a pressing portion 531 formed to correspond to the protrusion 193. The pressing portion 531 may be formed to apply physical pressure to the protrusion 193 or releases pressure applied to the protrusion 193 according to a movement of the connection portion 530. The pressing portion 531 may be made of a material hard enough to press the protrusion 193 to move it. For example, the pressing portion 531 may be made of plastic, silicon, or the like.

For example, referring to (a) and (b) of FIG. 9, in the first state, the protrusion 193 is pressed by the pressing portion 531, so a portion of the protrusion 193 is moved to the inward of the body of the mobile terminal 100. In the first state, the first member 510 covers the display unit 151 and the connection portion 530 covers the lateral surface of the mobile terminal, so the protrusion 193 continuously receives physical pressure applied thereto.

When the first state is switched to the third state according to a movement of the first member 510, the pressure applied to the protrusion 193 by the connection portion 530 is released. Accordingly, the protrusion 193 is moved to outward of the body of the mobile terminal 100.

When the pressure applied to the protrusion 193 is released, the controller 180 generates a state signal. Namely, the controller 180 may activate the display unit 151 on the basis of the state signal.

Meanwhile, when physical pressure applied to the protrusion 193 is continued for more than a pre-set time (a few seconds), the controller 180 may control the display unit 151 to be deactivated. Accordingly, when the mobile terminal 100 is installed in the cover 500 and the first member 510 covers the display unit 151, the display unit 151 can be more quickly controlled to be changed to a deactivated state, reducing power consumption.

According to the present embodiment, since the display unit 151 is controlled by the coupling structure of the cover 500 and the mobile terminal 100, an additional component electrically connecting the cover 500 and the mobile terminal 100 is not necessary.

Figure 10:
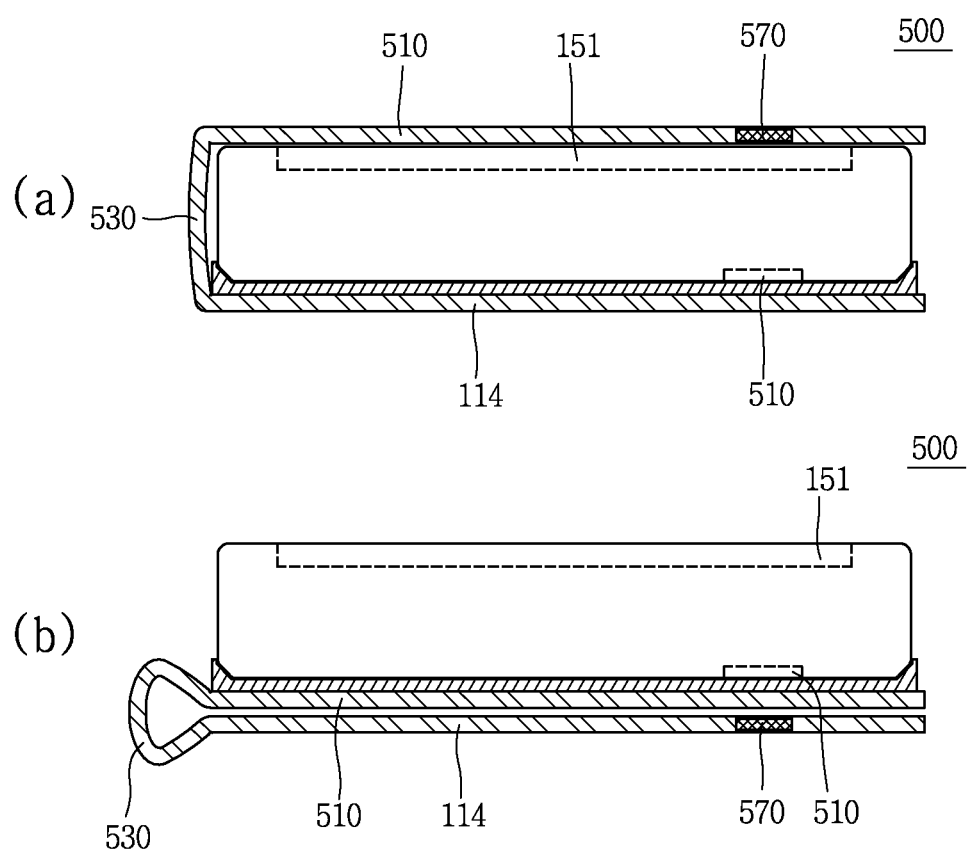
FIG. 10 is a partial cross-sectional view illustrating a mobile terminal installed in a cover according to another embodiment of the present invention.

FIG. 10 is a partial cross-sectional view illustrating the mobile terminal 100 installed in the cover according to another embodiment of the present invention. According to the present embodiment, the cover 500 includes an identification tag 570 sensed by the short range communication module 114.

The identification tag 570 may be installed in the first member 510. When the identification tag 570 is positioned to be close to the short range communication module 114, the controller 180 senses it and controls the short range communication module 114 to generate a state signal.

The short range communication module 114 according to the present embodiment is formed in a rear portion of the mobile terminal 100. When the cover 500 is changed from the first state to the fourth state, the short range communication module 114 may recognize the identification tag 570.

Thus, the identification tag 570 may be formed in a region corresponding to the short range communication module 114 in a state in which the first member 510 is disposed to overlap with the rear surface of the mobile terminal 100, namely, in the fourth state.

However, the position of the identification tag 570 is not limited thereto. However, preferably, the identification tag 570 may be disposed in a position sensed by the short range communication module 114 only in the fourth state, rather than being sensed by the short range communication module 114 in the first state.

According to the present embodiment, since the short range communication module cannot sense the identification tag 570 in the first to third states, the display unit 151 is controlled to be deactivated. Also, in the fourth state, when the short range communication module 114 and the identification tag 570 are disposed to be adjacent to each other, the short range communication module 114 senses the identification tag 570 and generates a state signal. Thus, the controller 180 activates the display unit 151 on the basis of the state signal.

According to the present embodiment, since the identification tag 570 having a relatively small size is formed within the cover 500 and a component for electrically connecting the cover and the mobile terminal 100 is not necessary, the structure of the cover 500 is simplified.

Figure 11:
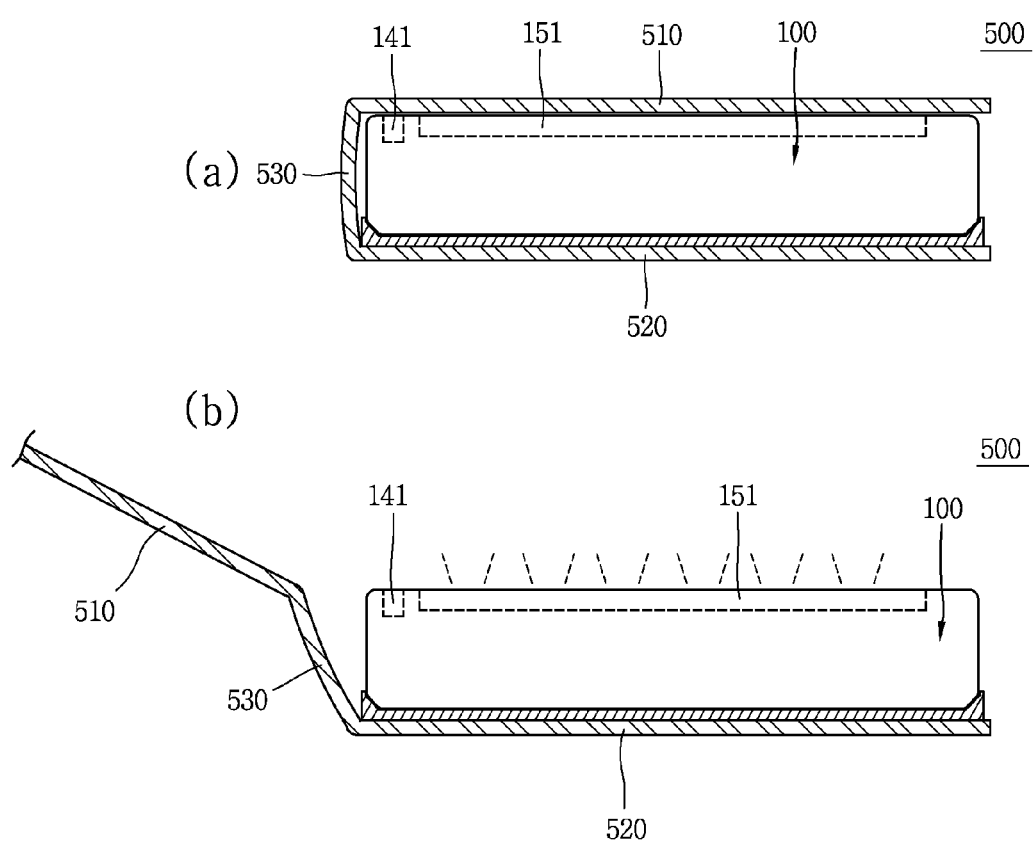
FIG. 11 is a partial cross-sectional view illustrating a mobile terminal installed in a cover according to another embodiment of the present invention.

FIG. 11 is a partial cross-sectional view illustrating the mobile terminal 100 installed in the cover according to another embodiment of the present invention.

The controller 180 according to the present embodiment controls the display unit 151 on the basis of the state signal generated by the proximity sensor 141 that senses an access of the first member 510. As described above, the proximity sensor 141 is a sensor that detects the presence or absence of an object existing nearby by using the force of electromagnetism or infrared rays without a mechanical contact. Thus, the proximity sensor 141 can recognize the first member 510 although the first member 510 is not in contact with the front surface of the mobile terminal 100.

The controller 180 may control the display unit 151 according to a state of the first member 510 that approaches the front surface of the mobile terminal 100 or is separated therefrom, sensed by the proximity sensor.

Namely, in a state in which the first member 510 is continuously sensed by the proximity sensor 141, when sensing of the first member 510 is released, the controller 180 may activate the display unit 151 on the basis of a state signal generated by the proximity sensor 141.

Meanwhile, the controller 180 may control the display unit 151 to be deactivated according to a state of the first member 510 sensed by the proximity sensor 141.

Also, the mobile terminal 100 may further include an illumination sensor (not shown). The illumination sensor may be disposed in the front surface of the mobile terminal 100 and may sense intensity of illumination of the front surface of the mobile terminal 100.

When intensity of illumination is sensed to be equal to a pre-set intensity of illumination by the illumination sensor, the controller 180 may activate the display unit 151.

Also, the controller 180 may control the display unit 151 upon receiving signals from the illumination sensor and the proximity sensor 141 simultaneously. The illumination sensor and the proximity sensor 141 may be disposed to be separated from each other. Thus, occurrence of an error that an activated state of the display unit 151 is changed when intensity of illumination of only a portion of the front surface of the mobile terminal 100 is changed or when an object approaches to a portion of the front surface of the mobile terminal, can be prevented.

The mobile terminal according to the embodiments of the present disclosure as described above is not limited in its application of the configurations and methods, but the entirety or a portion of the embodiments can be selectively combined to be configured into various modifications.

As the exemplary embodiments may be implemented in several forms without departing from the characteristics thereof, it should also be understood that the above-described embodiments are not limited by any of the details of the foregoing description, unless otherwise specified, but rather should be construed broadly within its scope as defined in the appended claims. Therefore, various changes and modifications that fall within the scope of the claims, or equivalents of such scope are therefore intended to be embraced by the appended claims.

What is claimed is:
1. A mobile terminal, comprising:
a terminal body comprising first and second surfaces;
a display unit formed on the first surface;
a cover comprising a first member connected to the second surface and a second member that covers the second surface, the first and second members coupled to the terminal body such that the cover and the terminal body are moveable with respect to each other into a closed state in which the display unit is substantially covered by the second member and an open state in which the display unit is at least partially exposed;
a signal generating unit configured to generate a different state signal according to the closed state and the open state of the cover; and
a controller configured to:
activate the display unit in the open state according to the generated state signal;
control the display unit to display first screen information in the open state;
define an overlap state when the first member overlaps the second member; and
control the display unit to display second screen information different from the first screen information in the overlap state.

2. The mobile terminal of claim 1, wherein the cover further comprises:
a connection portion connecting the first and second members, the connection portion configured to be deformed according to movement of the cover and the terminal body between the open state and the closed state,
wherein the signal generating unit comprises a deformation sensing film installed in the connection portion and configured to sense deformation of the connection portion.

3. The mobile terminal of claim 2, wherein:
the deformation sensing film is further configured to provide different currents according to deformation of the connection portion; and
the signal generating unit is further configured to generate the state signal according to the different currents.

4. The mobile terminal of claim 3, wherein:
the signal generating unit is further configured to generate a plurality of state signals according to the different currents; and
the controller is further configured to at least activate or adjust brightness of the display unit according to the plurality of state signals.

5. The mobile terminal of claim 1, wherein the signal generating unit is formed in regions of the first and second members that overlap in the closed state.

6. The mobile terminal of claim 5, wherein the signal generating unit comprises:
a magnet formed in the first member and configured to change magnetism according to movement of the cover and the terminal body between the open state and the closed state; and
a sensor formed in the second member and configured to sense a change in the magnetism.

7. The mobile terminal of claim 6, wherein the cover further comprises:
a terminal member electrically connected to the sensor and configured to transmit a signal to the controller.

8. The mobile terminal of claim 6, wherein the controller is further configured to control activation of the display unit according to the sensed change in the magnetism.

9. The mobile terminal of claim 1, wherein:
the signal generating unit comprises an identification tag installed in the first member; and
the terminal body further comprises a short-range antenna configured to sense the identification tag.

10. The mobile terminal of claim 9, wherein the signal generating unit is further configured to generate the state signal corresponding to the open state when the tag is sensed by the short-range antenna.

11. The mobile terminal of claim 1, wherein the signal generating unit comprises a conductive member installed in a surface of the first member that faces the display unit, the conductive member configured to change a value of flowing current upon being brought into contact with the display unit.

12. The mobile terminal of claim 11, wherein the controller is further configured to activate the display unit when an area of contact between the conductive member and the display unit is equal to or smaller than a pre-set reference area.

13. The mobile terminal of claim 1, wherein:
the signal generating unit comprises a protrusion formed on an outer surface of the terminal body, the protrusion configured to be pressurized according to movement of the first member; and
the controller is further configured to activate the display unit when the protrusion is released from a pressurized state.

14. The mobile terminal of claim 13, wherein:
the cover further comprises a connection portion connecting the first and second members, the connection portion configured to be deformed according to movement of the cover and the terminal body between the open state and the closed state; and
the connection portion comprises a pressing portion configured to pressurize the protrusion according to deformation of the connection portion.

15. The mobile terminal of claim 1, wherein:
the signal generating unit comprises at least an illumination sensor or a proximity sensor installed within the terminal body;
the illumination sensor is configured to sense a change in intensity of illumination outside the terminal body; and
the proximity sensor is configured to sense an object approaching within a pre-set distance of the display unit.

16. The mobile terminal of claim 15, wherein the controller is further configured to activate the display unit when an increase in the intensity of illumination is sensed and no object approaching the display unit is sensed.

17. The mobile terminal of claim 1, wherein the controller is further configured to activate the display unit when a pre-set time has lapsed since the state signal was generated.

* * * * *